(12) United States Patent
Hirai

(10) Patent No.: US 7,524,764 B2
(45) Date of Patent: Apr. 28, 2009

(54) METHOD OF FORMING FILM PATTERN, DEVICE, METHOD OF MANUFACTURING THE SAME, ELECTRO-OPTICAL APPARATUS, AND ELECTRONIC APPARATUS

(75) Inventor: Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 100 days.

(21) Appl. No.: 11/326,914

(22) Filed: Jan. 6, 2006

(65) Prior Publication Data

US 2006/0177951 A1 Aug. 10, 2006

(30) Foreign Application Priority Data

Feb. 4, 2005 (JP) .............................. 2005-028584

(51) Int. Cl.
*H01L 21/44* (2006.01)
(52) U.S. Cl. ........................... 438/671; 438/584; 430/5; 257/E21.174; 257/E21.582
(58) Field of Classification Search ................. 438/500, 438/502, 763, 20, 30, 597, 533, 584, 671; 430/5
See application file for complete search history.

(56) References Cited

U.S. PATENT DOCUMENTS

| | | | |
|---|---|---|---|
| 6,610,552 B2 | 8/2003 | Fujimori et al. | |
| 6,755,983 B2* | 6/2004 | Yudasaka | 216/5 |
| 6,810,814 B2* | 11/2004 | Hasei | 101/485 |
| 2002/0151161 A1* | 10/2002 | Furusawa | 438/597 |
| 2003/0211643 A1* | 11/2003 | Fujimori et al. | 438/22 |
| 2004/0082163 A1* | 4/2004 | Mori et al. | 438/630 |
| 2004/0201048 A1* | 10/2004 | Seki et al. | 257/294 |
| 2005/0158665 A1* | 7/2005 | Maekawa et al. | 430/313 |
| 2006/0040435 A1* | 2/2006 | Morisue et al. | 438/151 |
| 2006/0281333 A1* | 12/2006 | Shin et al. | 438/780 |

FOREIGN PATENT DOCUMENTS

| | | |
|---|---|---|
| JP | 11-271753 | 10/1999 |
| JP | 2002-237383 | 8/2002 |
| JP | 2004-337779 | 12/2004 |

* cited by examiner

Primary Examiner—W. David Coleman
Assistant Examiner—Shaka Scarlett
(74) Attorney, Agent, or Firm—Harness, Dickey & Pierce, P.L.C.

(57) ABSTRACT

A method of forming a film pattern by disposing a functional liquid on a substrate, includes: forming banks on the substrate; disposing the functional liquid in areas partitioned by the banks; and drying the functional liquid disposed on the substrate, wherein the forming of the banks including: forming a plurality of layers made of inorganic materials; patterning a plurality of the layers by using an organic mask; and removing the organic mask.

4 Claims, 17 Drawing Sheets

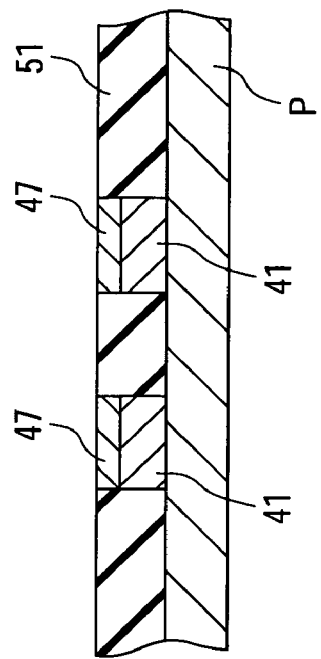
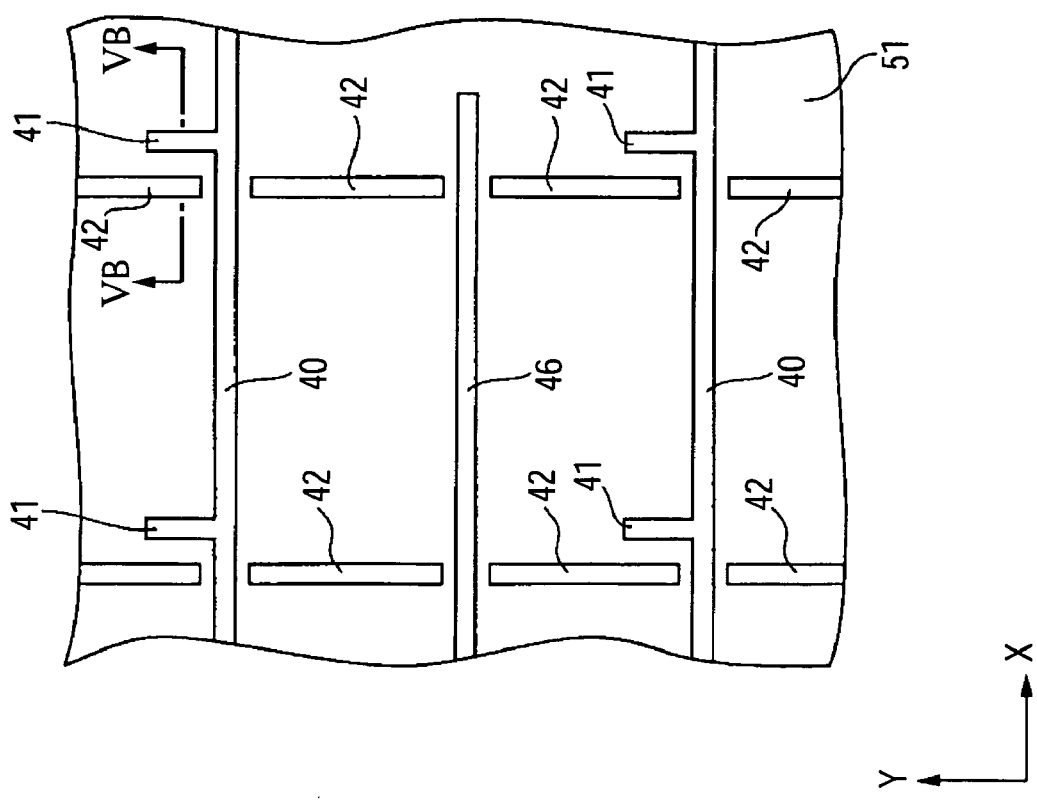
FIG. 5B
FIG. 5A

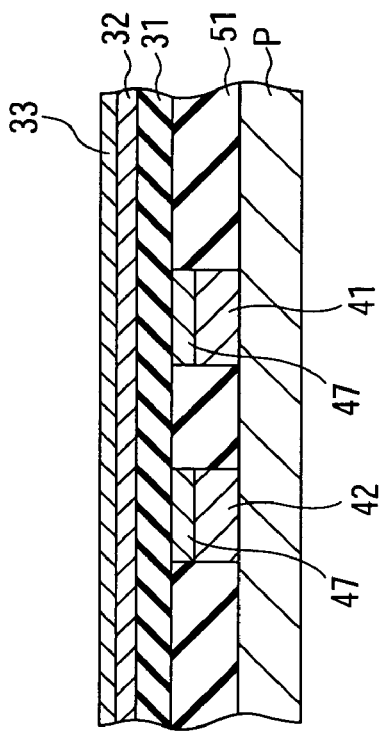
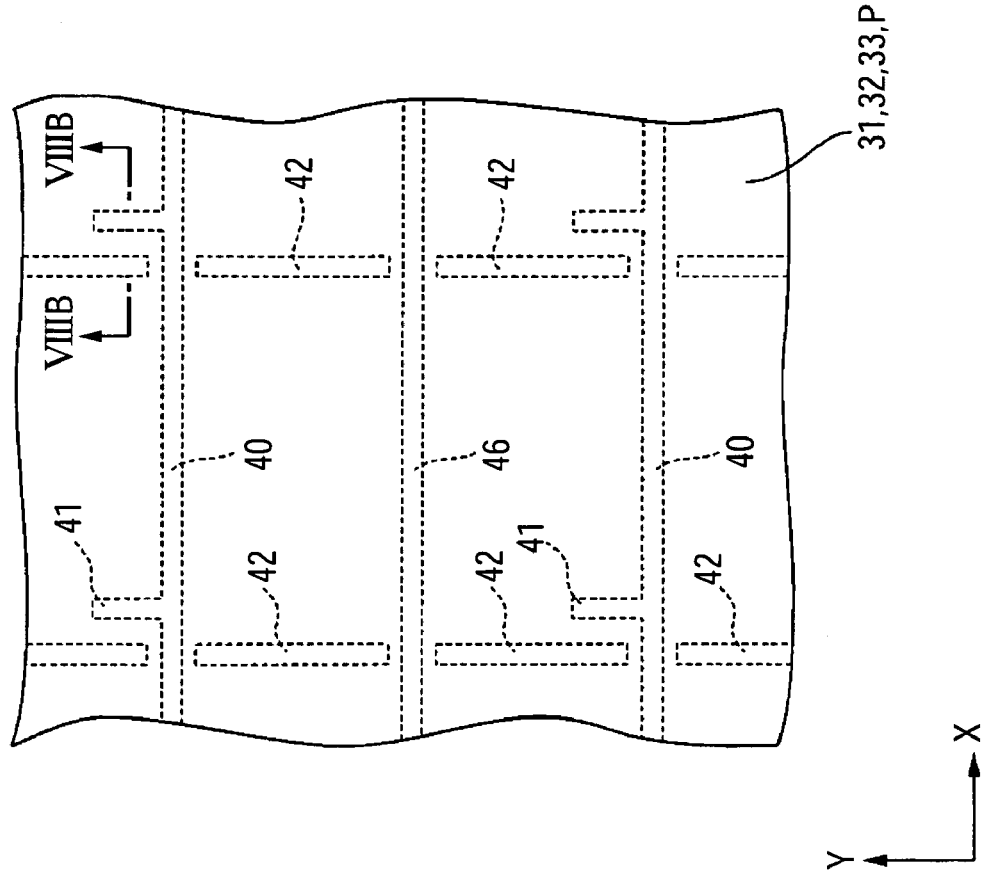
FIG. 8B
FIG. 8A

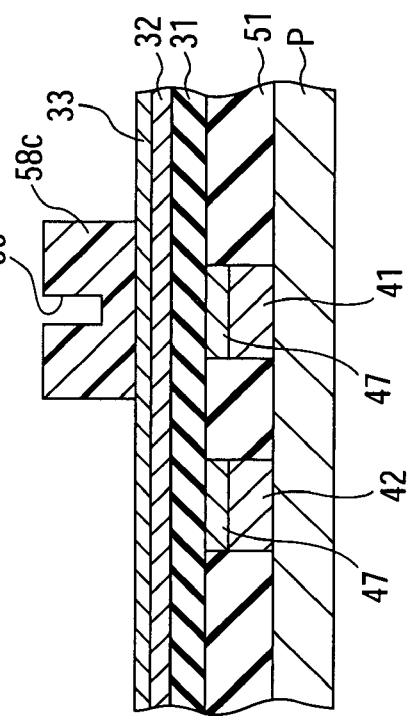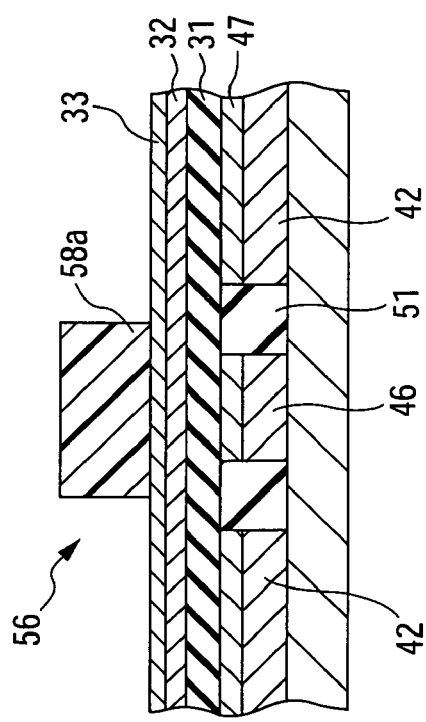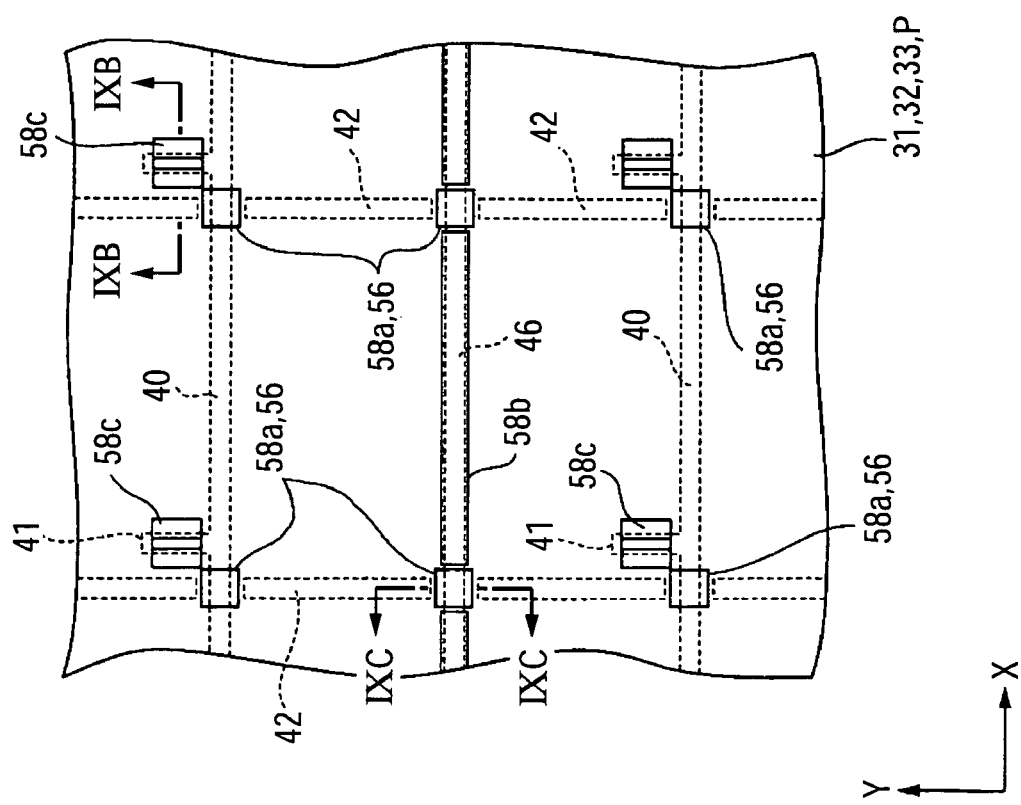

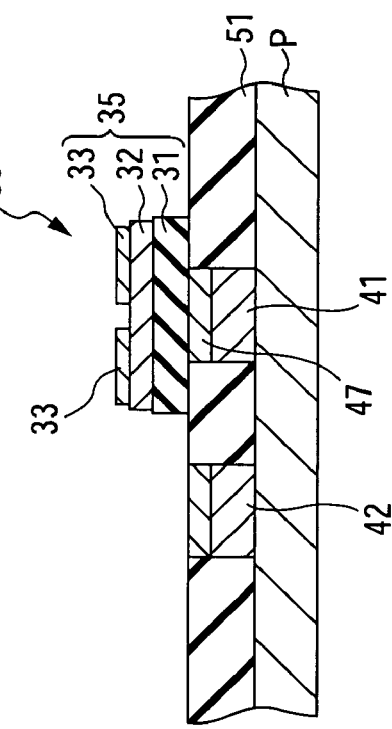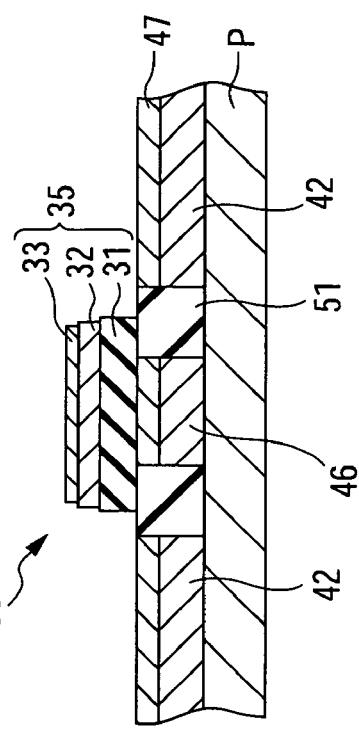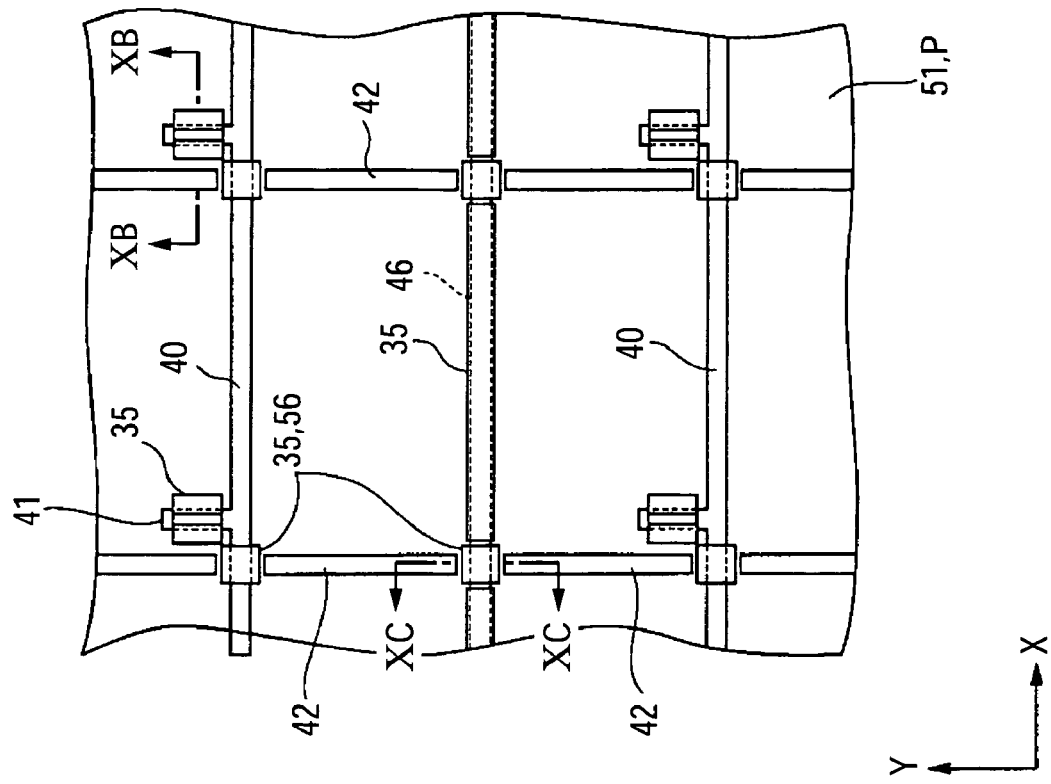

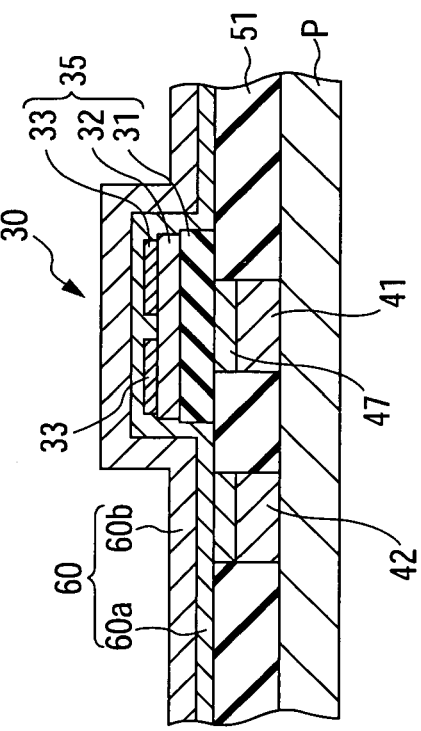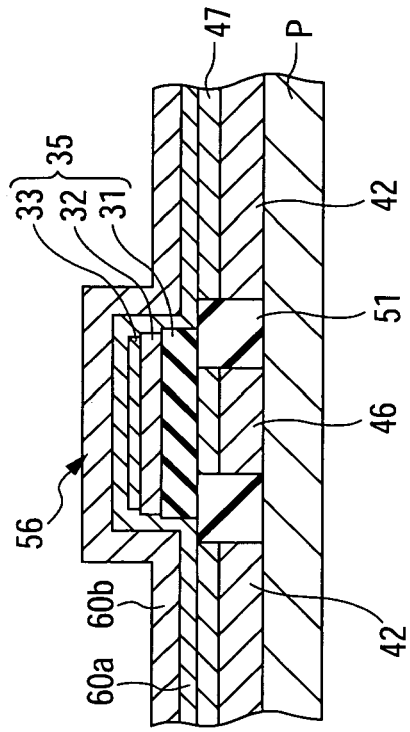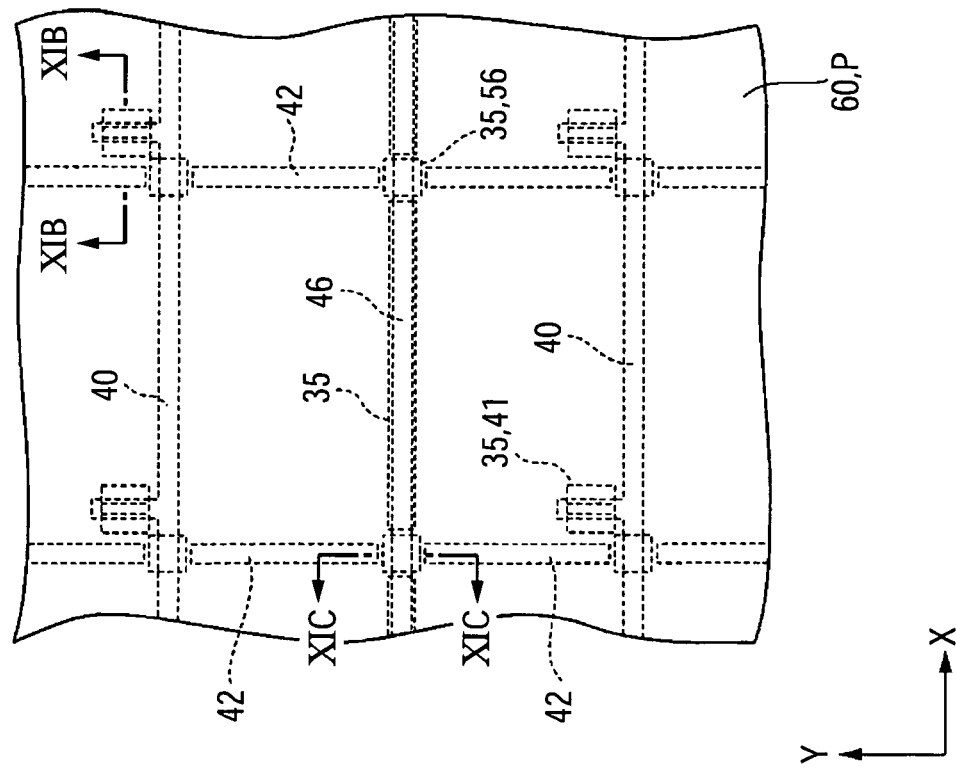

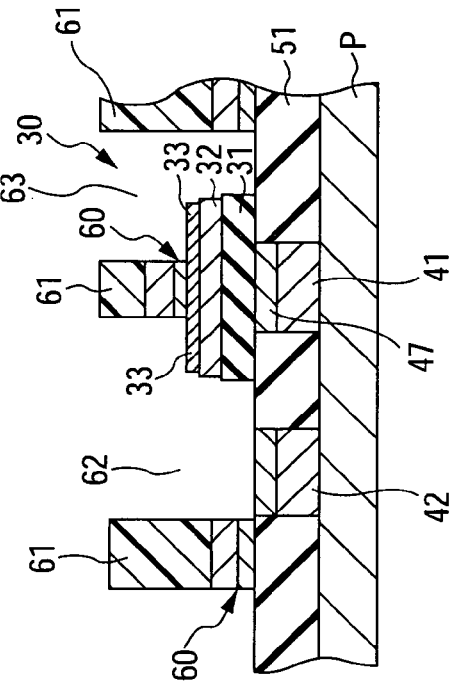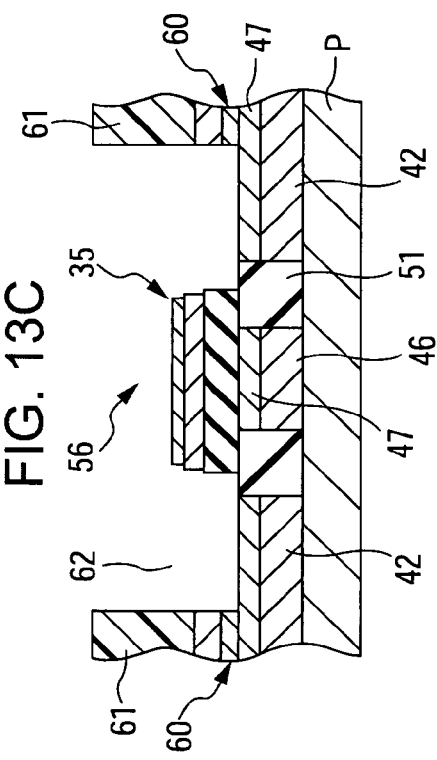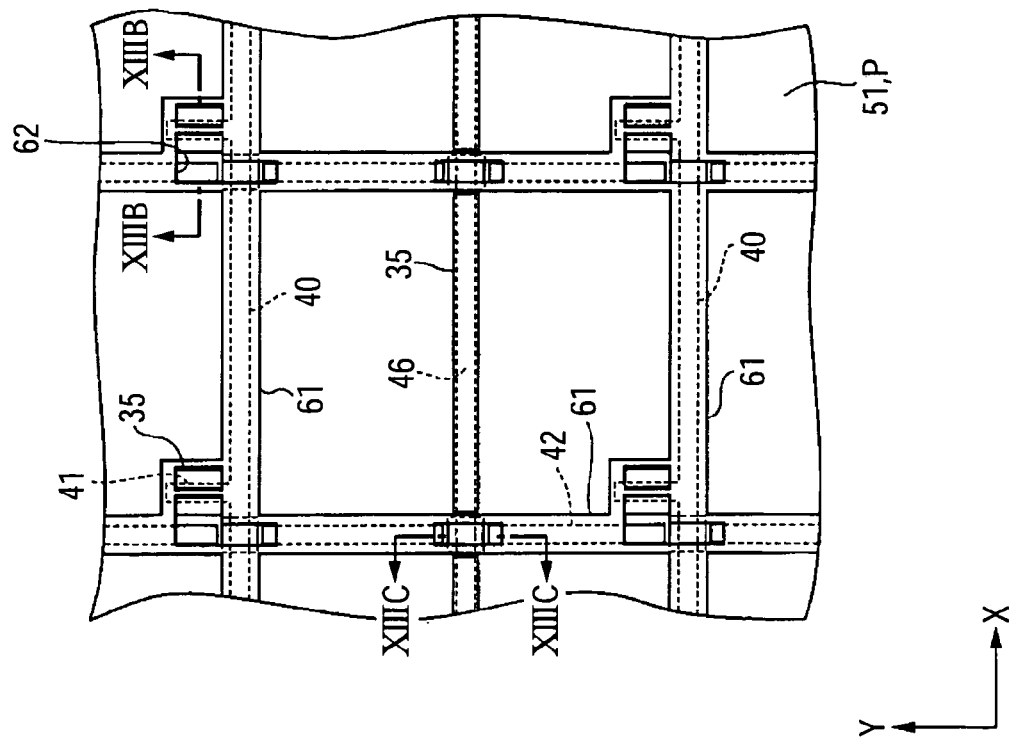
FIG. 13A
FIG. 13B
FIG. 13C

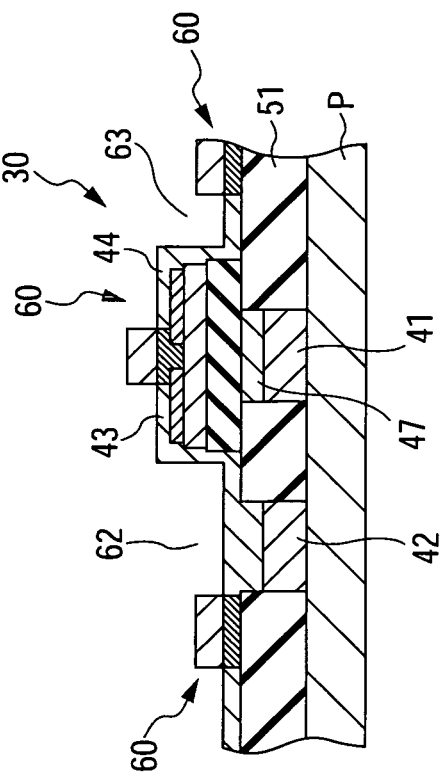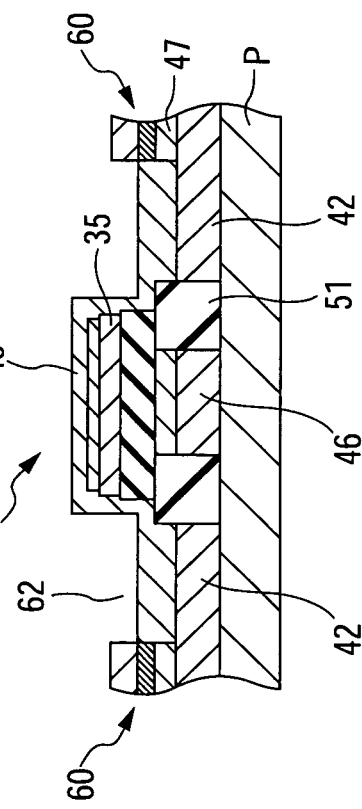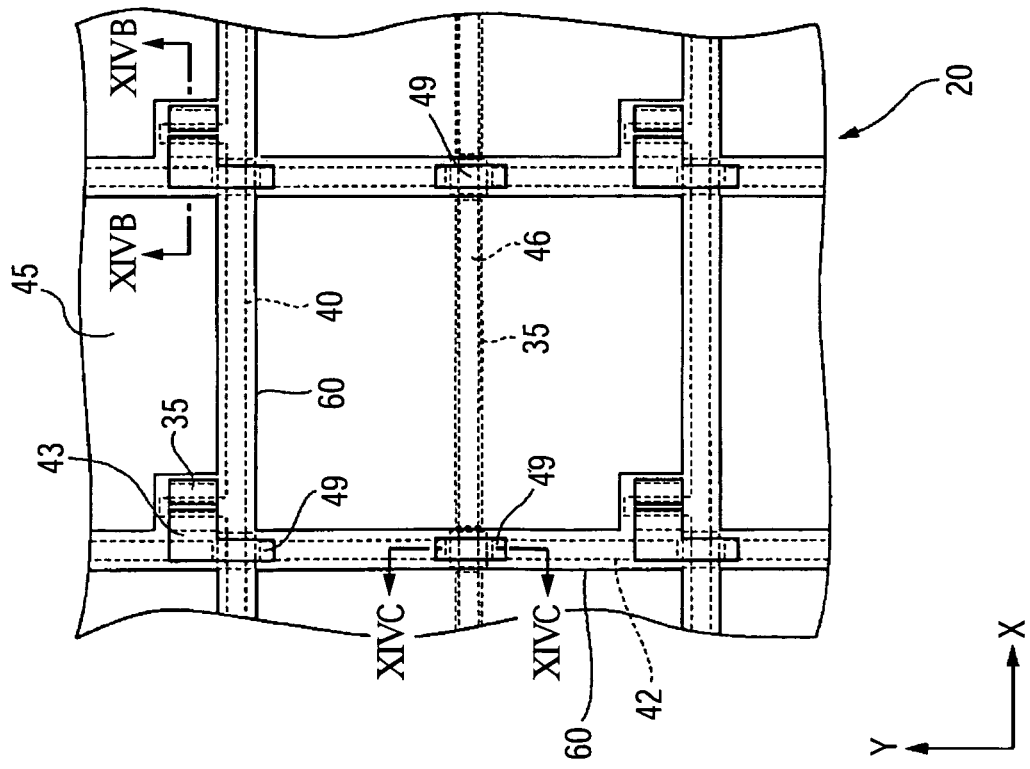

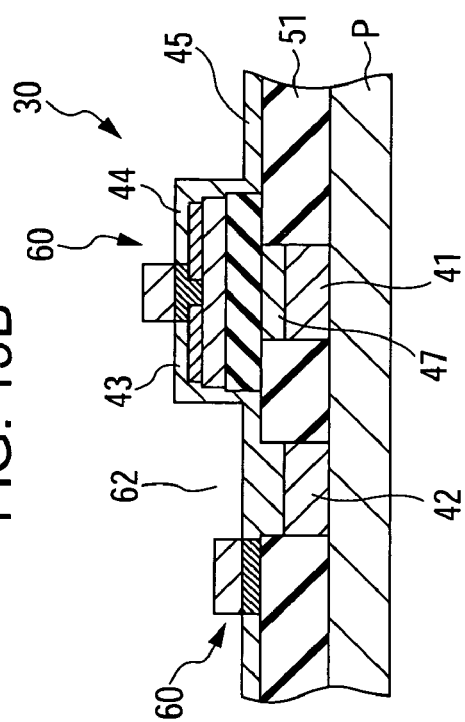
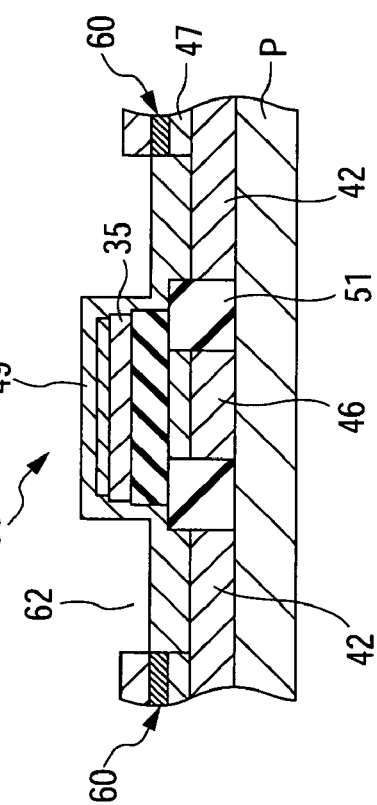
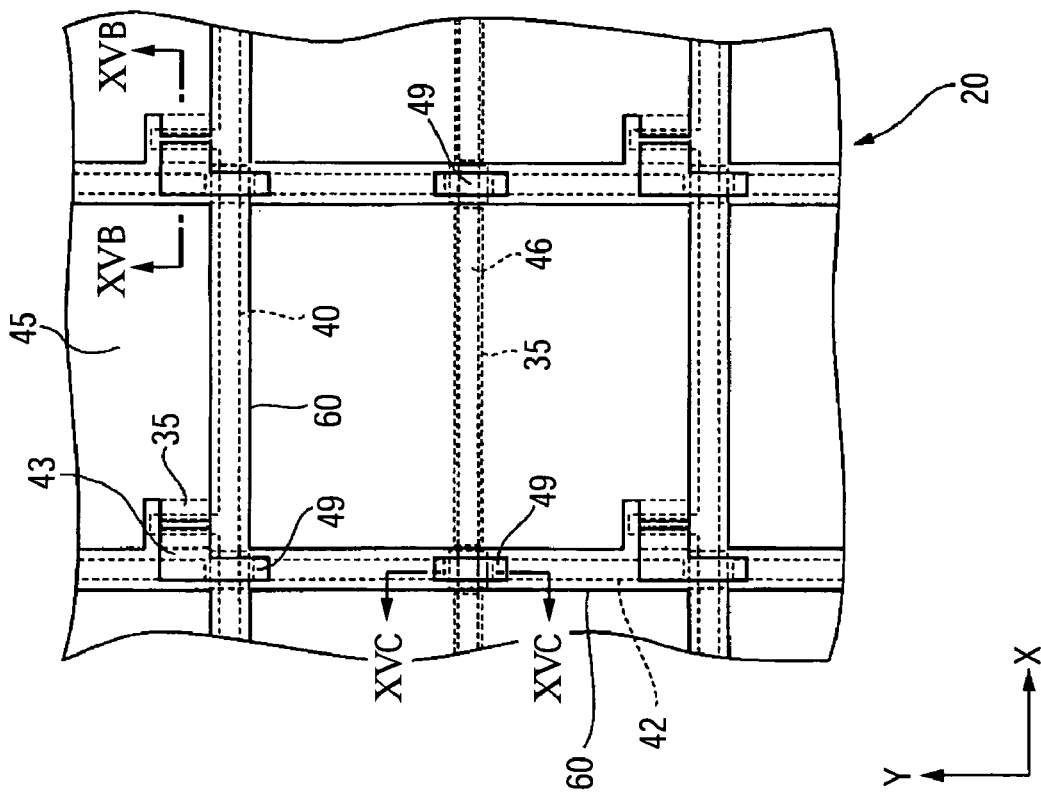

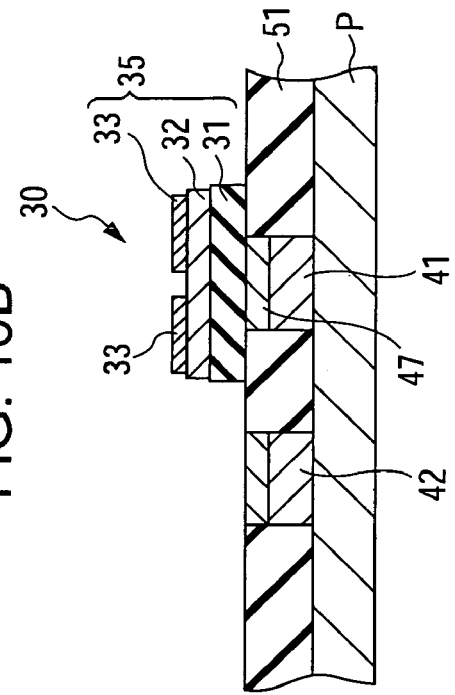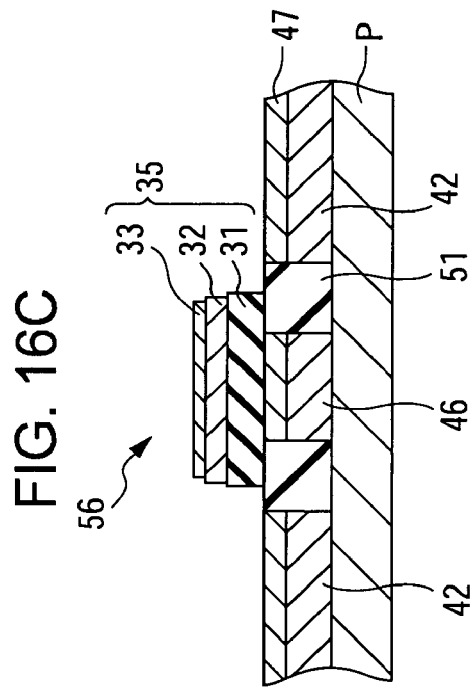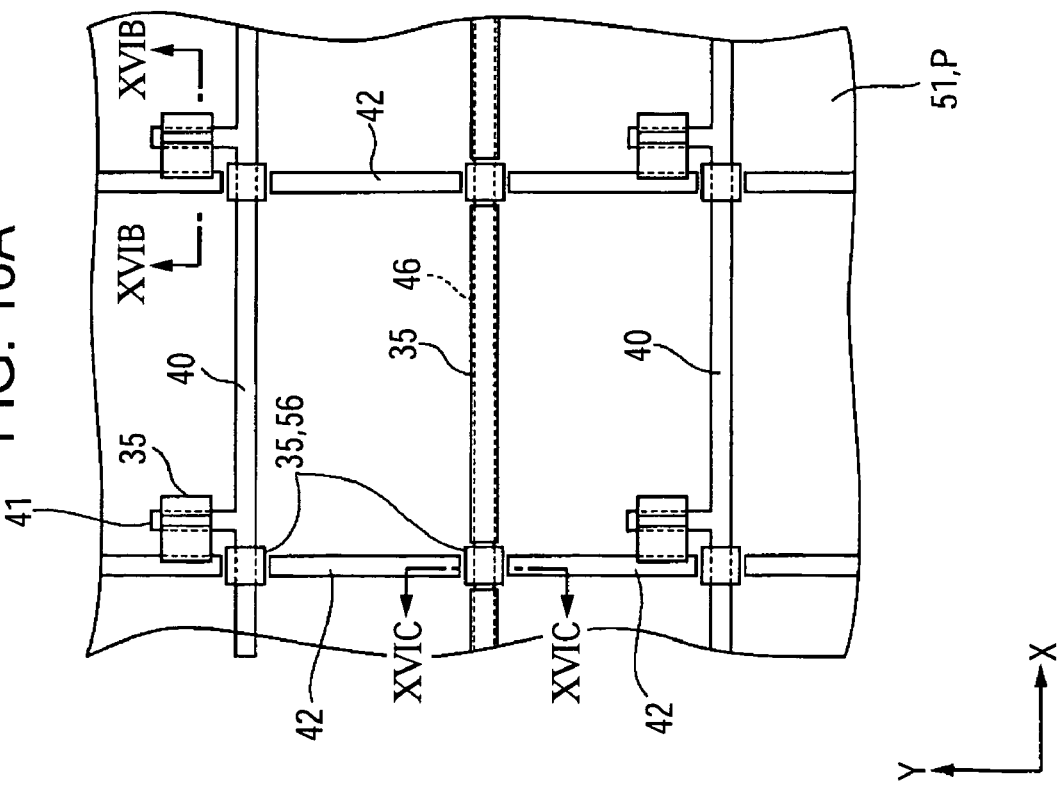

METHOD OF FORMING FILM PATTERN, DEVICE, METHOD OF MANUFACTURING THE SAME, ELECTRO-OPTICAL APPARATUS, AND ELECTRONIC APPARATUS

BACKGROUND

1. Technical Field

The present invention relates to a method of forming a film pattern, a device, a method of manufacturing the same, an electro-optical apparatus, and an electronic apparatus.

2. Related Art

As a method of forming devices having wires such as electronic circuits and integrated circuits, for example, a photolithography method is widely used. In the photolithography method, a wire pattern of a thin film is formed by applying a photosensitive material called a resist on a substrate on which a conductive film is applied in advance, illuminating and developing a circuit pattern, and etching the conductive film in accordance with the resist pattern. The photolithography method requires large-scaled apparatuses such as a vacuum apparatus, an exposing apparatus and complex processes. In addition, since use-efficiency of materials is merely a low percentage, most the materials must be wasted, so that there is a problem of a high production cost.

On the other hand, there is proposed a method of forming a wire pattern on a substrate by using a liquid droplet ejecting method of ejecting a liquid material in droplets from a liquid droplet ejecting head, that is, a so-called inkjet method (for example, see JP-A-11-271753). In the inkjet method, a wire pattern forming ink, that is, a functional liquid where conductive particles such as metal particles are dispersed is directly disposed in a pattern on the substrate, and after that, a thermal treatment and a laser illumination are performed, so that the pattern is converted into a conducive film pattern of a thin film. According to the inkjet method, since a photolithography process is unnecessary, the processes can be remarkably simplified, and an amount of used raw materials can be reduced.

In a case where a film pattern is formed on the substrate by using the inkjet method, in order to prevent ink from spreading, a barrier structure called a bank is formed. As a material for the bank, an organic material (a polymer material such as acryl resin, polyimide resin, olefin resin, and melamine resin) has been used. However, in order to form the wires or the like, a high temperature baking process is required after the inkjet process. Therefore, there are problems of change in colors and thicknesses of the thin film in the banks made of the organic material. In particular, during a process for manufacturing a TFT substrate, since a required baking temperature exceeds a thermal-resistant temperature of the organic material, the aforementioned problems are more serious.

SUMMARY

Advantage of the invention is to provide a method of forming a film pattern capable of stably forming a micro and high-performance film pattern, a device, a method of manufacturing the same, an electro-optical apparatus, and an electronic apparatus.

The invention has the following aspects.

According to an aspect of the invention, there is provided a method of forming a film pattern by disposing a functional liquid on a substrate, comprising: forming banks on the substrate; disposing the functional liquid in areas partitioned by the banks; and drying the functional liquid disposed on the substrate, wherein the forming of the banks including: forming a plurality of layers made of inorganic materials; patterning a plurality of the layers by using an organic mask; and removing the organic mask.

In the method of forming the film pattern according to the invention, the functional liquid is disposed in areas portioned by banks, and the functional liquid is dried, so that the film pattern is formed. In this case, since a shape of the film pattern is defined by the bank, decrease in size and width of the film pattern can be accomplished by suitably forming the banks, for example, by reducing an interval between the adjacent banks. In the method, since a material for the banks contains inorganic materials, the banks can have a high thermal-resistant property, and a difference between thermal expansion ratios of the banks and the substrate can be reduced. As a result, deterioration of the banks caused by heat during the drying process of the functional liquid is suppressed, so that the film pattern can have a good shape.

Here, although the inorganic material layer is patterned by using an organic mask made of an organic material such as a resist, in many cases, the organic mask may not be removed, but the remaining organic mask may be used as a bank together with the inorganic material layer. This is because it is difficult to secure a desired thickness of the bank by using only the inorganic film. However, if the organic film is remained as the bank, there is a problem in terms of a thermal resistant property, and the bank can be used in a process requiring a high temperature treatment. In addition, an inorganic mask may be used instead of the organic mask. However, in this case, there is a problem in that an etching selection ratio to the inorganic film cannot be secured.

Accordingly, in the invention, the organic mask is removed, and the thickness of the bank is secured by forming a plurality of the inorganic material layers. According to the method, a sufficient thickness of the bank can be secured, and a problem in an etching selection ration does not occur. As a result, a film pattern of which size and width decrease can be stably formed with a high precision.

In the above aspect, it is preferable that a top surface layer of a plurality of the layers is made of a lyophobic material.

According to the method, it is possible to obtain a state where only the surface of the bank becomes lyophobic and the sides of the bank do not become lyophobic. Therefore, in a case where a micro pattern is formed, a function liquid can smoothly flow into the banks, so that a uniformity of the film can be improved. In addition, since the surfaces of the banks become lyophobic, it is possible to accurately dispose the functional liquid on only the regions between the banks.

In addition, it is preferable that the method of forming a film pattern comprises, before the patterning a plurality of the layers, performing a lyophobic process on the top surface layer.

According to the method, since the lyophobic process is performed before the patterning of the bank, it is possible to obtain a state where only the top surface layer of the bank becomes lyophobic, and the sides of the bank do not become lyophobic. Therefore, in a case where a micro pattern is formed, a function liquid can smoothly flow into the banks, so that a uniformity of the film can be improved.

In addition, it is preferable that the functional liquid is disposed in the areas by using a liquid droplet ejecting method.

According to the method, by using the liquid droplet ejecting method, it is possible to reduce consumption of liquid materials and easily control an amount and position of the function liquid disposed on the substrate, in comparison to a case of using other coating techniques such as a spin coat method.

According to another aspect of the invention, there is provided a method of manufacturing a device having a film pattern formed on a substrate, comprising forming the film pattern on the substrate by using the aforementioned method of forming a film pattern.

In the method of manufacturing a device according to the invention, it is possible to stably decrease in size and width of a film pattern formed on the device. As a result, it is possible to stably manufacture a high resolution device.

In particular, in a case where the film pattern constitutes a portion of a switching element such as a TFT (thin film transistor) formed on the substrate, it is possible to stably implement a highly integrated switching element.

According to still another aspect of the invention, there is provided a device manufactured by using the aforementioned method of forming a device. According to further still another aspect of the invention, there is provided an electro-optical apparatus comprising the aforementioned device. According to further still another aspect of the invention, there is provided an electronic apparatus comprising the aforementioned electro-optical apparatus.

As a result, it is possible to provide a high-performance device, electro-optical apparatus, and electronic apparatus.

As an example of the electro-optical apparatus, there are a liquid crystal display apparatus, an organic electroluminescence display apparatus, a plasma display panel, and the like.

BRIEF DESCRIPTION OF THE DRAWING

The invention will be described with reference to the accompanying drawings, wherein like numbers reference like elements and wherein:

FIG. 5 is a view showing a procedure subsequent to FIG. 4.

FIG. 8 is a view showing a procedure subsequent to FIG. 5.

FIG. 9 is a view showing a procedure subsequent to FIG. 8.

FIG. 10 is a view showing a procedure subsequent to FIG. 9.

FIG. 11 is a view showing a procedure subsequent to FIG. 10.

FIG. 13 is a view showing a procedure subsequent to FIG. 12.

FIG. 14 is a view showing a procedure subsequent to FIG. 13.

FIG. 15 is a view showing a procedure subsequent to FIG. 14.

FIG. 16 is a schematic view showing another exemplary embodiment of an active matrix substrate.

DESCRIPTION OF EXEMPLARY EMBODIMENTS

Hereinafter, the present invention will be described with reference to the accompanying drawings.

Figure 1:
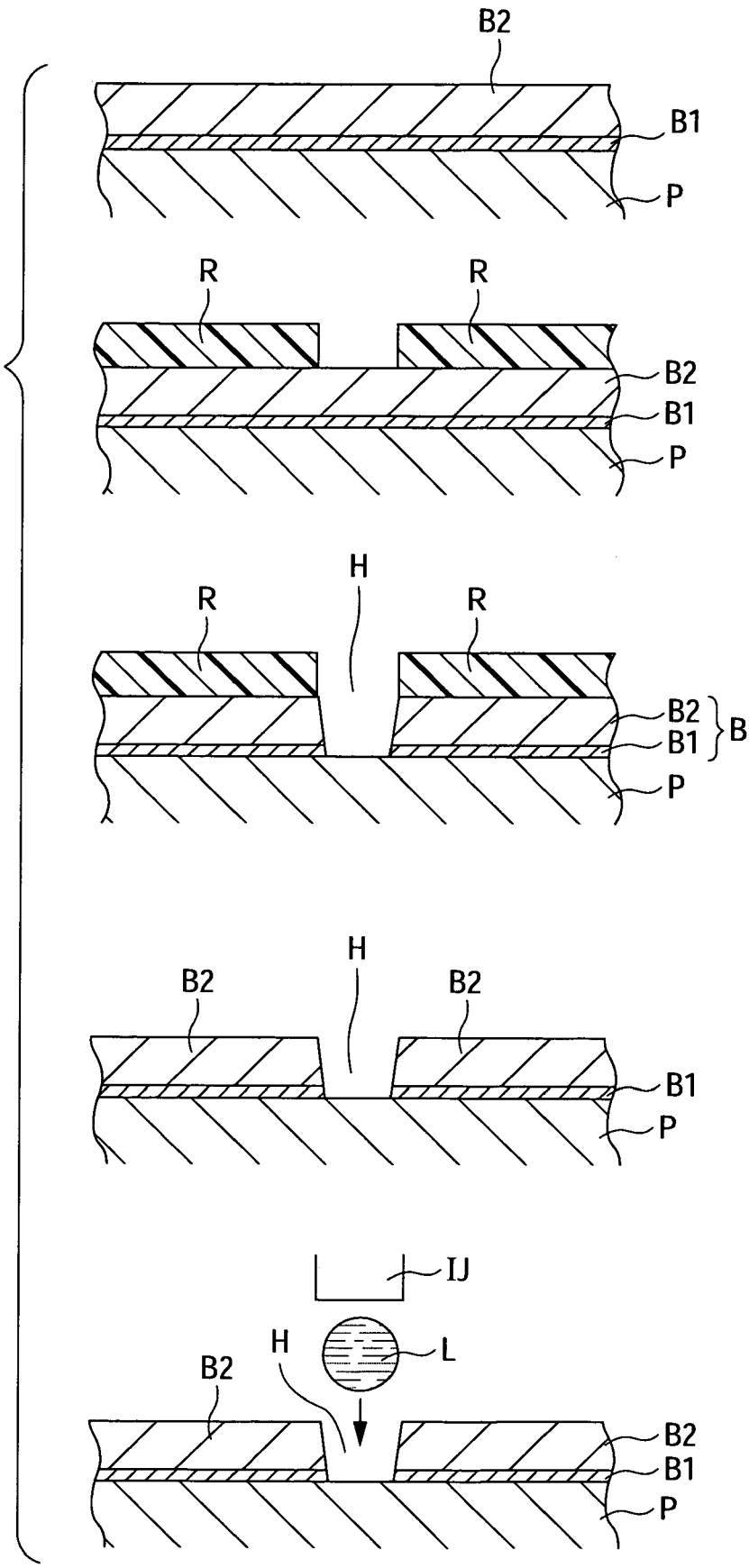
FIG. 1 is a schematic conceptual view showing a method of forming a film pattern according to the present invention.

FIG. 1 is a schematic conceptual view showing a method of forming a film pattern according to the present invention.

The method of forming a film pattern according to the invention includes a bank forming process for forming banks B on a substrate P, a material disposing process for disposing a functional liquid L in areas partitioned by the banks B, and a drying (baking) process for drying the functional liquid L disposed on the substrate P.

In the method of forming the film pattern according to the invention, the functional liquid L is disposed in the areas partitioned by the banks B, and the functional liquid L is dried, so that a film pattern F is formed on the substrate P. In this case, since a shape of the film pattern F is defined by the banks B, decrease in size and width of the film pattern F can be accomplished by suitably forming the banks B, for example, by reducing an interval between the adjacent banks B. In addition, after the film pattern F is formed, the banks B may be removed from the substrate P, or the banks B may be remained on the substrate P.

Various methods such as a lithography method and a printing method may be used as the method of forming the bank. For example, in case of using the lithography method, a layer made of the material for the banks is formed on the substrate P by using a spin coat method, a spray coat method, a roll coat method, a dye coat method, a deep coat method, or the like, and after that, pattering is performed by using a etching or ashing process, so that the banks having a predetermined pattern is obtained. In addition, the banks may be formed on another member instead of the substrate P, and then, the member may be disposed on the substrate P.

In addition, in the method of forming the film pattern according to the invention, an inorganic material is used as the material for the banks B. As an example of a method of forming the banks B by using the inorganic material, there is a method of forming the banks B in a predetermined shape by forming a layer made of the inorganic material on the substrate P with various coat processes or a CVD (chemical vapor deposition) process and performing patterning with an etching process. Here, a plurality of the layers B1 and B2 made of the inorganic material are formed. The object is to secure a thickness of the bank B. Next, a plurality of the layers B1 and B2 are patterned by using a resist mask (organic mask) R which is an organic film, and after the patterning, the resist mask R is removed. As a result, the inorganic banks B can be formed to be thick.

In addition the banks may be formed on another member instead of the substrate P, and then, the member may be disposed on the substrate P.

As an example of the inorganic material for the banks, there are an inorganic polymer material or an photosensitive inorganic material where a silica is contained in a backbone of polysilazane, polysiloxane, a siloxane resist, a polysiloxane resist, or the like, a silica glass, a spin-on-glass film containing any one of alkyloxane polymer, alkylsilsesquioxane polymer, hydrogenated alkylsilsesquioxane polymer, and polyarlyether, a diamond film, and an amorphous fluorinated carbon film. In addition, as the inorganic material for the banks, aerogel or porous silica or a fluorinated $SiO_2$ formed by using a CVD method may be used.

It is preferable that the surface of the bank B has a lyophobic property. As a result, the functional liquid can not attached on the top surface of the bank, so that it is possible to accurately form the film pattern in a desired shape. As a method of providing a lyophobic property to the banks, there is a method of performing a plasma process using a fluorine-containing gas or the like on the surfaces of the bank or a method of forming the banks with a lyophobic material (a material filled with a lyophobic component such as a fluorine group). However, in case of performing the lyophobic process, if the lyophobic process is performed after the pattering of the bank materials B1 and B2, the sides of the banks B also become lyophobic. Therefore, when the functional liquid L is ejected and disposed between the banks, the functional liquid L is repelled from the banks B, so that a uniform film cannot be formed. For the reason, in case of performing the lyophobic process, it is preferable that, the lyophobic process is performed on the top surfaces of the layers B1 before the pattering of a plurality of the layers B1 and B2. As a result, only the top surfaces (layers B1) of the banks become lyophobic, and the sides of the banks do not become lyophobic, so that the uniformity of the film can be improved. Similarly, in case of forming the banks with the lyophobic material, it is preferable that only the layers B2 of the top surface of the banks are formed with the lyophobic material, and other layers B1 are formed with a material having no lyophobic property (for example, a material having a lyophilic property).

In the invention, various functional liquids (inks) L may be used. The functional liquid denotes a liquid capable of forming a film having a predetermined function by converting film components included in the liquid into the film. The associated function includes an eclectic or electronic function (conductive, insulating, piezoelectric, pyroelectric, and dielectric properties), an optical function (selectively light-absorbing, reflective, polarizing, light selectively-transmitting, non-linear optical, luminescent (fluorescent, phosphorescent, or the like), and photochromic properties), a magnetic function (hard magnetic, soft magnetic, and non-magnetic properties, and magnetic permeability), a chemical function (adsorptive, de-adsorptive, water-adsorptive, ion-conductive, oxidative, de-oxidative, electro-chemical, and electro-chromic properties), a mechanical function (abrasion resistant property, or the like), a thermal function (thermal conductive, adiabatic, and IR-radiative properties), a biological function (bio-suitability and anti-thrombotic property). As an example of the aforementioned functional liquid L, an ink exhibiting a conductive property by performing a thermal or optical treatment can be used to form a conductive film pattern. The conductive film pattern can be employed as wire lines for various devices.

A preferred method of disposing the functional liquid in the areas partitioned by the banks is a liquid droplet ejecting method, that is, so-called inkjet method. By using the liquid droplet ejecting method, it is possible to reduce consumption of liquid materials and easily control an amount and position of the function liquid disposed on the substrate, in comparison to a case of using other coasting techniques such as a spin coat method.

Now, as an example of a method of manufacturing a device according to a first embodiment of the invention, a method of manufacturing an active matrix substrate by using a method of forming a film pattern according to the invention will be described.

Active Matrix Substrate

Figure 2:
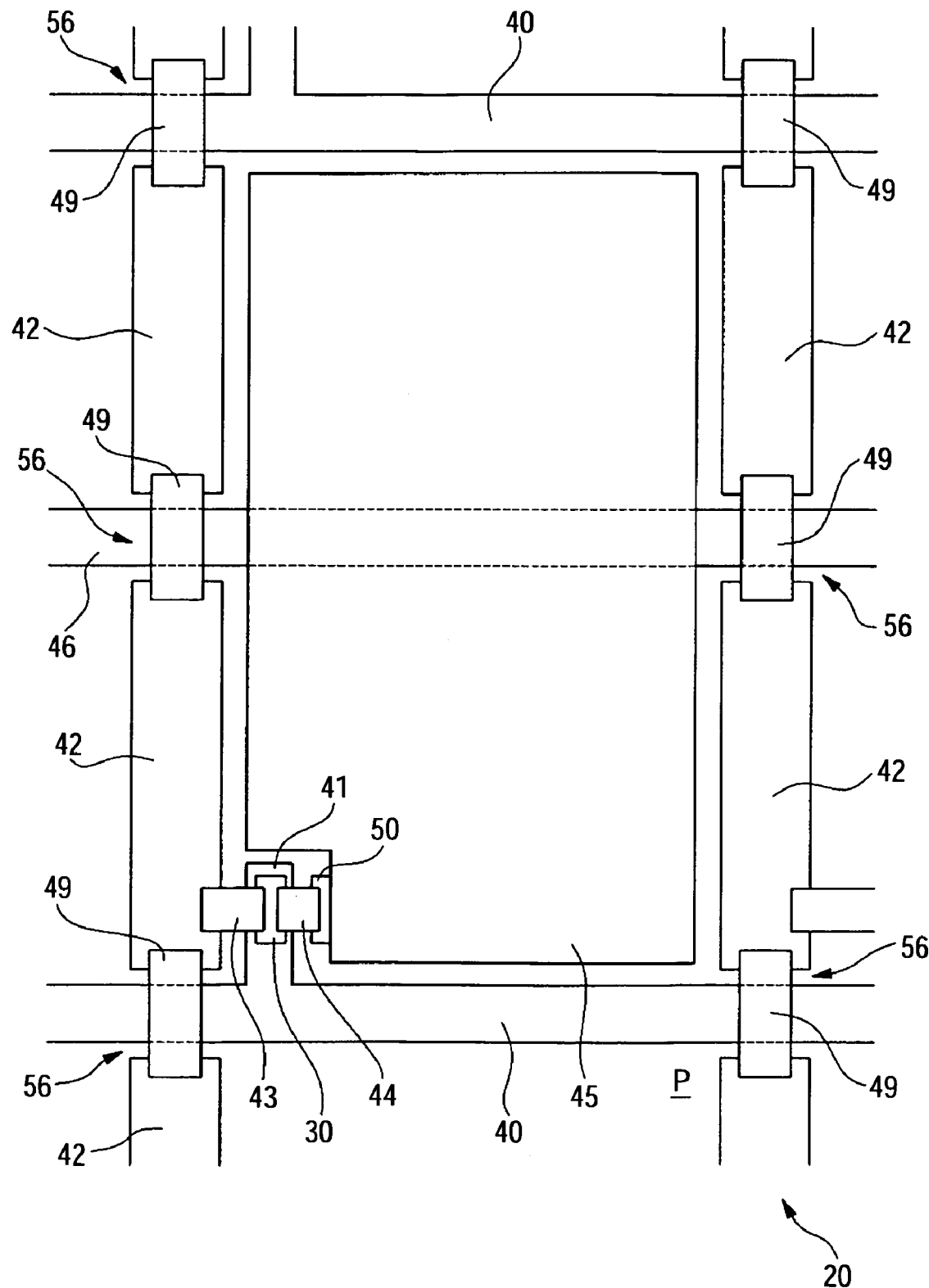
FIG. 2 is a partially enlarged view showing an active matrix substrate.

FIG. 2 is a partially enlarged view showing an active matrix substrate according to an embodiment.

Gate wires 40 and source wires 42 are formed in a lattice pattern on the active matrix substrate 20. Namely, a plurality of the gate wires 40 are formed to extend in the X direction (first direction), and a plurality of the source wires 42 are formed to extend in the Y direction (second direction).

The gate wires 40 are connected to gate electrodes 41, and a TFT 30 is disposed on each gate electrode 41 with an insulating layer therebetween. On the other hand, the source wires 42 are connected to source electrodes 43, and one end of each source electrode 43 is connected to the TFT (switching element) 30.

Pixel electrodes 45 are disposed in areas surrounded with the gate wires 40 and the source wires 42, and each pixel electrode is connected to the TFT 30 through the drain electrode 44.

Capacitor lines 46 are formed on the active matrix substrate 20 to be approximately parallel to the gate wires 40. The capacitor lines 46 are disposed under the pixel electrodes 45 and the source wires 42 with an insulating layer therebetween.

The gate wires 40, the gate electrodes 41, the source wires 42, and the capacitor lines 46 are formed on the same plane.

Figure 3:
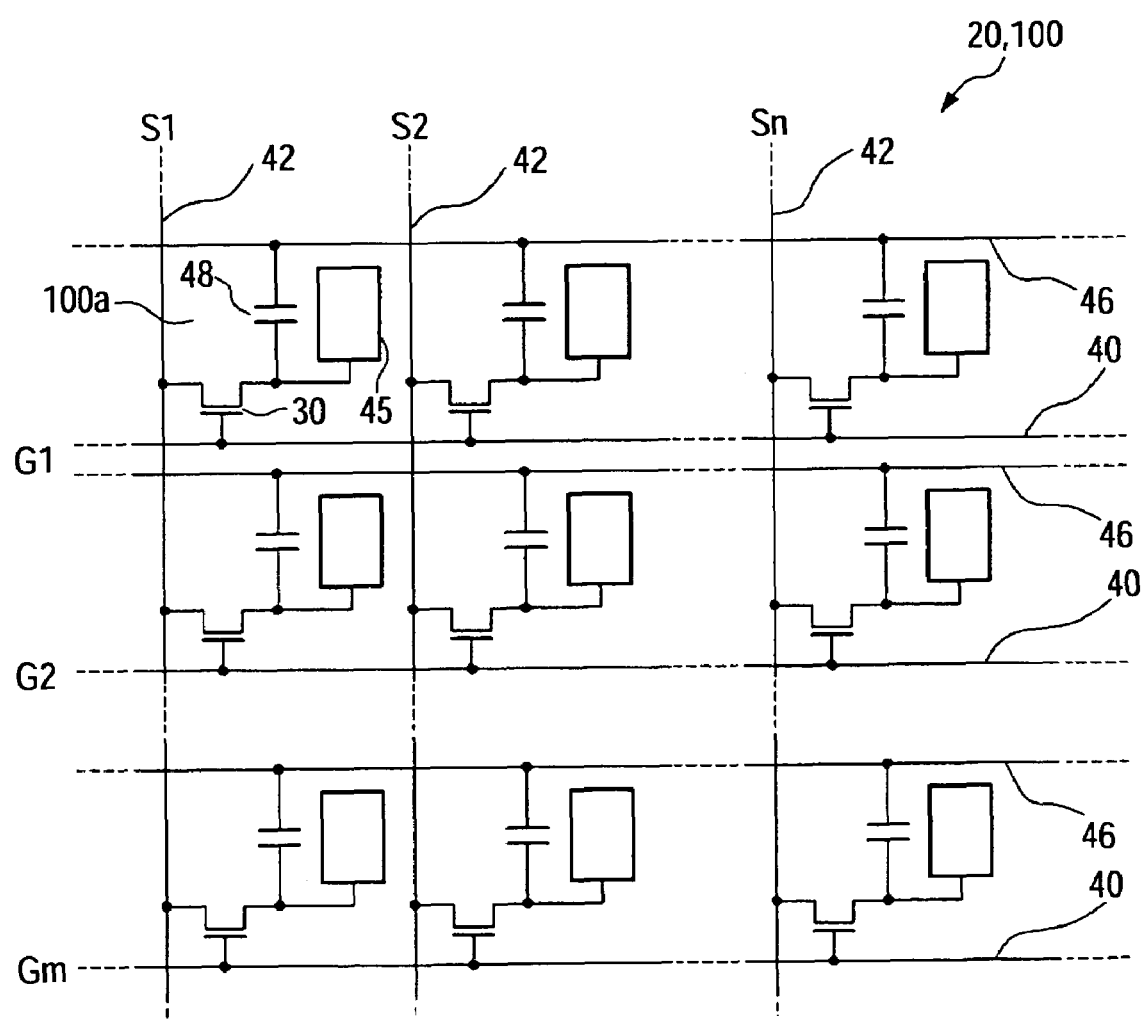
FIG. 3 is an equivalent circuit diagram showing an active matrix substrate.

FIG. 3 is an equivalent circuit diagram of the active matrix substrate 20 which is used for a liquid crystal display device.

When the active matrix substrate 20 is used for the liquid crystal display device 100, a plurality of pixels 100a are formed in a matrix in an image display area. In each pixel 100a, a pixel switching TFT 30 is formed, and the source wire 42 for supplying pixel signals S1, S2, . . . , Sn is electrically connected to the source of the TFT 30 through the source electrode 43. The pixel signals S1, S2, . . . , Sn may be supplied line-sequentially to the source wire 42 in that order and may be supplied to a plurality of source wires 42 adjacent to each other in a unit of groups.

The gate wire 40 is electrically connected to the gate of the TFT 30 through the gate electrode 41. At a predetermined time point, scanning signals G1, G2, . . . , Gm are supplied in pulses line-sequentially to the gate wire 40 in that order.

The pixel electrode 45 is electrically connected to the drain of the TFT 30 through the drain electrode 44. By, turning on the TFT 30, that is, a switching element only for a predetermined period of time, the pixel signals S1, S2, . . . , Sn supplied from the source wires 42 are written to the pixels at a predetermined timing. In this way, the pixel signals S1, S2, . . . , Sn having predetermined levels written to liquid crystal through the pixel electrodes 45 are sustained between a counter electrode 121 of a counter substrate 120 shown in FIG. 18 and the pixel electrodes for a predetermined time period.

In order to prevent the sustained pixel signals S1, S2, . . . , Sn from leaking, storage capacitors 48 are provided in parallel to liquid crystal capacitors formed between the pixel electrodes 45 and the counter electrode 121 by the capacitor lines 46. For example, the voltage of the pixel electrodes 45 is sustained by the storage capacitors 48 for a period of time that is by three orders longer than a time when the source voltage is applied. Accordingly, a charge sustaining characteristic is improved, so that it is possible to implement the liquid crystal display device 100 a high contrast ratio.

Method of Manufacturing Active Matrix Substrate

Now, a method of manufacturing the active matrix substrate 20 will be described.

The active matrix substrate 20 is manufactured through a first process of forming lattice-patterned wires on a substrate P, a second process of forming a stacked portion 35, and a third process of forming the pixel electrodes 45. In the embodiment, the method of forming a film pattern is applied to processes for forming the source electrodes 43, the drain electrodes, 44, and the pixel electrodes 45.

Hereinafter, the processes will be described in detail.

First Process: Formation of Wires

Figure 4B:
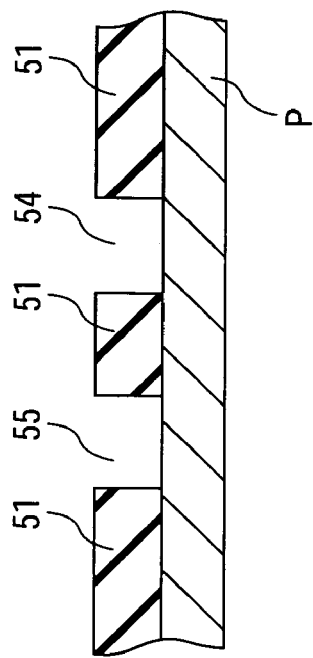
FIG. 4 is a view showing a procedure of a method of manufacturing an active matrix substrate.
Figure 4A:
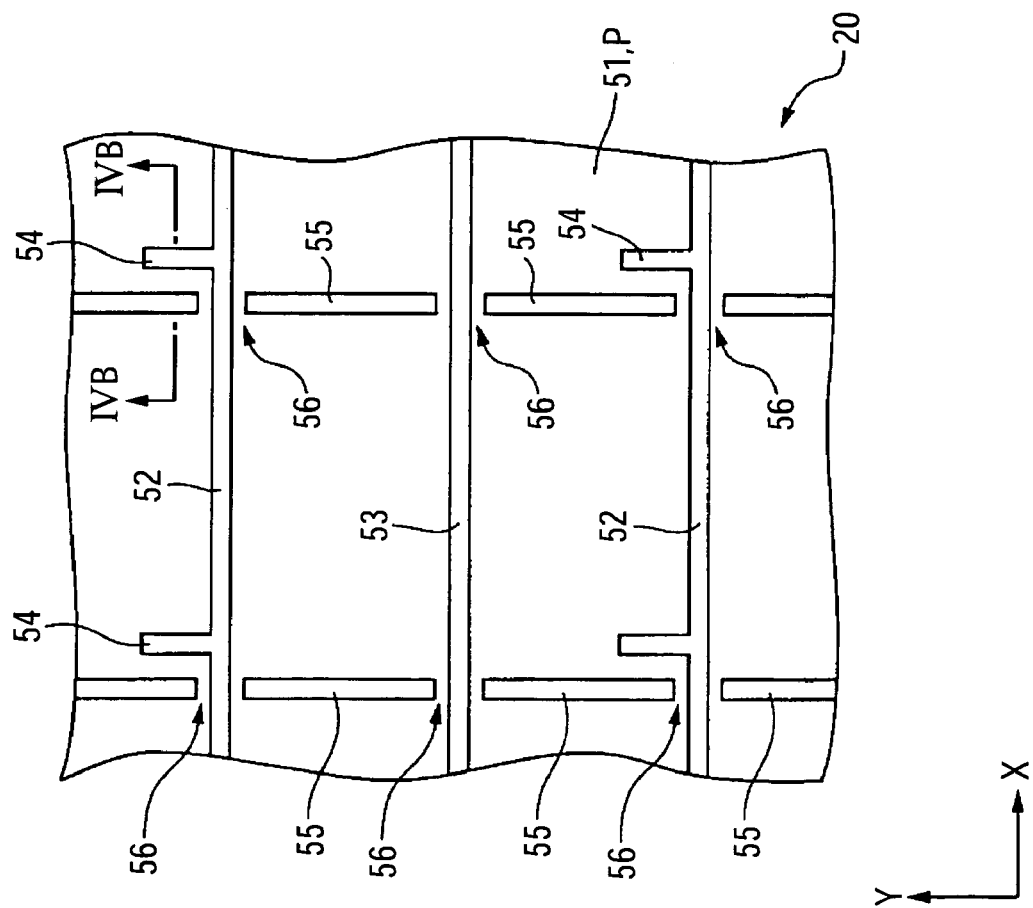

FIGS. 4 and 5 are views showing a wire forming process as the first process. FIGS. 4B and 5B are cross sectional views taken along Line A-A' of FIGS. 4A and 5A, respectively.

The substrate P on which the lattice-patterned wires such as the gate wires 40 and the source wires 42 are formed may be made of various materials such as glass, quartz glass, Si wafer, plastic film, and metal plate. The substrate includes a semiconductor film, a metal film, a dielectric film, an organic film, or the like formed as a base layer on the surface of the substrate made of the various materials.

Firstly, as shown in FIG. 4, banks 51 made of an insulating material are formed on the substrate P. The banks are used to dispose a later-described wiring ink at a predetermined position of the substrate P.

More specifically, as shown in FIG. 4A, the banks 51 having a plurality of openings 52, 53, 54, and 55 corresponding to positions at which the lattice-patterned wires are to be formed are formed on the surface of a cleaned substrate P by using a photolithography method.

The banks 51 may be made of a polymer material such as acryl resin, polyimide resin, olefin resin, and melamine resin. In addition, by taking into heat resistance or the like, an inorganic material may be included in the banks. As an example of the inorganic material for the banks, there is an inorganic polymer material or an photosensitive inorganic material where a silica is contained in a backbone of polysilazane, polysiloxane, a siloxane resist, a polysiloxane resist, or the like, a silica glass, a spin-on-glass film containing any one of alkyloxane polymer, alkylsilsesquioxane polymer, hydrogenated alkylsilsesquioxane polymer, and polyarylether, a diamond film, and an amorphous fluorinated carbon film. In addition, as examples of the inorganic material for the banks, aerogel or porous silica or the like may be used. In case of using a photosensitive material such as a photosensitive polysilazane composite containing polysilazane and a photoacid generator, the resist mask is unnecessary, so that the aforementioned material is more preferred. In addition, a lyophobic process is performed on the banks 51 so as to efficiently dispose the wiring ink into the openings 52, 53, 54, and 55. As the lyophobic treatment, a $CF_4$ plasma process (a plasma process with a gas containing fluorine) is preformed. Alternatively, instead of the $CF_4$ plasma process, a material for the banks 51 may be filled with a lyophobic component (such as a fluorine group) in advance.

The openings 52, 53, 54, and 55 formed by the banks 51 correspond to the lattice-patterned wires such as the gate wires 40 and the source wires 42. Namely, by disposing the wiring ink in the openings 52, 53, 54, and 55 of the banks 51, the lattice-patterned wires such as the gate wires 40 and the source wires 42 are formed.

More specifically, the openings 52 and 53 formed to extend in the X direction correspond to the positions at which the gate wires 40 and the capacitor lines 46 are to be formed. In addition, the openings 54 corresponding to the positions at which the gate electrodes 41 are to be formed are connected to the openings 52 corresponding to the positions at which the gate wires 40 are to be formed. In addition, the openings 55 formed to extend in the Y direction correspond to the positions at which the source wires 42 are to be formed. The openings 55 extending in the Y direction are divided at the intersections 56 so as not to intersect the openings 52 and 53 extending in the X direction.

Next, by ejecting and disposing the wiring ink containing conductive particles in the openings 52, 53, 54, and 55 with a later-described liquid droplet ejecting apparatus IJ, the lattice-patterned wires such as the gate wires 40 and the source wires 42 are formed on the substrate.

The wiring ink includes a solution in which conductive particles are dispersed in a dispersion medium or a solution in which organic silver compounds or silver oxide nano-particles are dispersed in a solvent (dispersion medium). The conductive particles may include metal particles of gold, silver, copper, tin, lead, or the like, particles of oxide materials thereof, conductive polymer particles, or super-semiconductor particles. Surfaces of the conductive particles may be coated with an organic material so as to improve the dispersion characteristic.

It is preferable that a diameter of the conductive particles is in a range of from 1 nm to 0.1 μm. If the particle diameter is greater than 0.1 μm, a nozzle of a later-described liquid droplet ejecting head may be clogged. If the particle diameter is smaller than 1 nm, a volume ratio of a coating agent to the conductive particles increases, so that the ratio of organic materials contained in the resultant film is too large.

If capable of dispersing the conductive particles and not causing cohesion, the dispersion medium is not particularly limited. Examples of the dispersion medium may include water, alcohols such as methanol, ethanol, propanol, butanol, etc., hydrocarbon compounds such as n-heptane, n-octane, decane, dodecane, tetradecane, toluene, xylene, cymene, durene, indene, dipentene, tetrahydro naphthalene, decahydro naphthalene, cyclohexyl benzene, etc., ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, p-dioxane, etc., polar compounds such as propylene carbonate, γ-butyrolactone, N-methyl-2-pyrrolidone, dimethyl formamide, dimethyl sulfoxide, cyclohexanone, etc., and so on. Among the aforementioned ones, in terms of a dispersion property of particles, stability of a dispersion solution, and easy application to the liquid droplet ejecting method (inkjet method), water, alcohols, hydrocarbon compounds, and ether compounds are a preferable dispersion medium, and water and hydrocarbon compounds are a more preferable dispersion medium.

It is preferable that a surface tension of a dispersion solution of the conductive particles is in a range of from 0.02 N/m to 0.07 N/m. In ejecting liquid by the inkjet method, when the surface tension is smaller than 0.02 N/m, wettability of the ink compositions to the nozzle surface increases, so that a curved ejection trajectory can be easily caused. On the other hand, when the surface tension is greater than 0.07 N/m, a meniscus shape at the nozzle end is not stabilized, so that it is difficult to control an ejection amount or an ejection timing. In order to adjust the surface tension, a surface tension adjusting agent such as a fluorine agent, a silicon agent, and a nonionic agent may be slightly added to the dispersion solution within a range in which a contact angle with the substrate does not greatly decrease. The nonionic surface-tension adjusting agent improves the wettability of a liquid to the substrate and the leveling property of a film, thereby preventing micro unevenness of the film. The surface-tension adjusting agent may contain organic compounds such as alcohol, ether, ester, and ketone as needed.

It is preferable that a viscosity of the dispersion solution is in a range of from 1 mPa·s to 50 mPa·s. In ejecting a liquid material in droplets by using the inkjet method, when the viscosity is smaller than 1 mPa·s, the surroundings of the nozzle can be easily contaminated due to the outflow of ink. When the viscosity is greater than 50 mPa·s, the occurrence of the clogging of the nozzle increases, so that it difficult to smoothly eject the liquid droplets.

After ejecting the wiring ink to the substrate P, a dry process and a baking process are performed so as to remove the dispersion medium, as needed.

The dry process can be performed by heating the substrate P with a hot plate, an electric furnace, or the like. The heating may be performed, for example, at a temperature of 180° C. for 60 minutes.

The process temperature of the baking process is properly determined by taking into consideration a boiling point (vapor pressure) of the dispersion medium, thermal behaviors such as a dispersion property and an oxidation property of the particles, presence or absence and an amount of the coating agent, a heat-resistant temperature of a base material, and the like. For example, in order to remove the coating agent made of organic materials, it is necessary to perform a baking process at a temperature of 250° C.

The electrical contact between the conductive particles can be secured by performing the dry and baking processes, thereby obtaining a conductive film.

A protective metal film 47 may be formed on the wires such as the gate wires 40 and the source wires 42. The protective metal film 47 is a thin film for suppressing a (electro) migration phenomenon of the conductive film made of silver or copper. It is preferable that the protective metal film 47 is made of nickel. In addition, the protective metal film 47 made of nickel is also disposed on the substrate P by using the liquid droplet ejecting method.

Through the processes described above, as shown in FIG. 5, a layer including the banks 51, the lattice-patterned wires is formed on the substrate P.

As an example of the ejection technique for the liquid droplet ejecting method, there are a charging control technique, a pressing vibration technique, an electro-mechanical conversion technique, an electro-thermal conversion technique, and an electrostatic suction technique. In the charging control technique, charges are added to a material with a charging electrode, and the flying direction of the material is controlled with a deflecting electrode, thereby ejecting the material from the nozzles. In the pressing vibration technique, a high pressure of about 30 kg/cm² is applied to a material to eject the material from distal ends of the nozzles. Here, if a control voltage is not applied, the material is ejected with a straight trajectory from the nozzles. If the control voltage is applied, electrostatic repulsion occurs between the materials, the material is scattered, and thus, not ejected from the nozzles. The electromechanical conversion technique utilizes a property that a piezoelectric element is deformed with a pulse-like electrical signal. Here, a pressure is applied to a space storing the material through a flexible material by means of the deformation of the piezoelectric element to push out the material from the space, thereby ejecting the material from the nozzles.

In the electro-thermal conversion technique, the material is rapidly vaporized by generating bubbles with a heater provided in the space storing the material, and the material in the space is ejected due to the pressure of the bubbles. In the electrostatic suction technique, the material is ejected by applying a minute pressure to the space storing the material to form a meniscus of the material at the nozzles and then applying an electrostatic attractive force. In addition, a technique using a change in the viscosity of a fluid due to an applied electric field or a technique of ejecting the material with discharged sparks may be used. The liquid droplet ejecting method has a merit in that materials are negligibly wasted and a desired amount of material can be accurately deposited at a desired position. The amount of liquid material (fluid) ejected in a single droplet in the liquid droplet ejecting method is about 1 to 300 ng.

Figure 6:
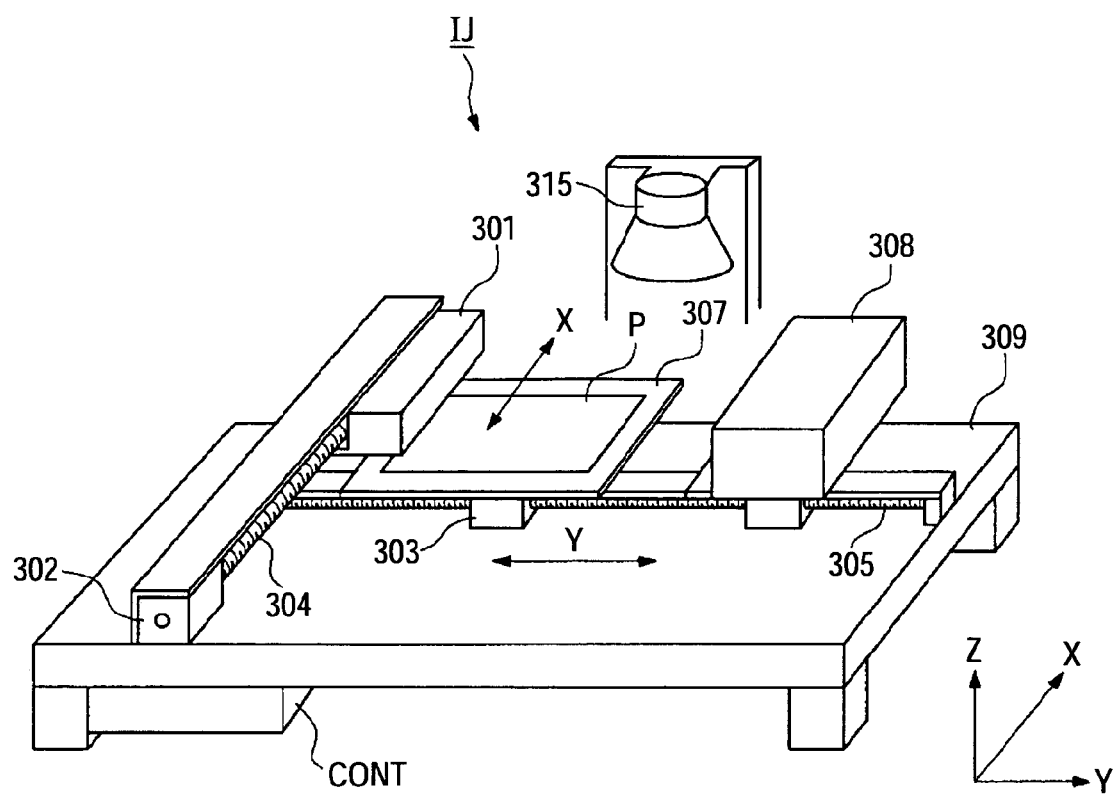
FIG. 6 is a schematic perspective view showing a liquid droplet ejecting apparatus.

The liquid droplet ejecting apparatus IJ shown in FIG. 6 is used as a liquid droplet ejecting apparatus used to form the lattice-patterned wires.

The liquid droplet ejecting apparatus (inkjet apparatus) IJ is an apparatus for ejecting (dropping) liquid droplets to the substrate P from a liquid droplet ejecting head. The liquid droplet ejecting apparatus includes a liquid droplet ejecting head 301, an X direction driving shaft 304, a Y direction guide shaft 305, a controller CONT, a stage 307, a cleaning mechanism 308, a stand 309, and a heater 315. The stage 307 supports the substrate P on which ink (liquid material) is disposed by the liquid droplet ejecting apparatus IJ and includes a fixing mechanism (not shown) for fixing the substrate P to a reference position.

The liquid droplet ejecting head 301 is a multi-nozzle type liquid droplet ejecting head having a plurality of ejecting nozzles. Here, the longitudinal direction of the liquid droplet ejecting head 301 is coincident to the Y axis direction. A plurality of ejecting nozzles are aligned with a constant interval in the Y axis direction on the lower surface of the liquid droplet ejecting head 301. The ink containing the aforementioned conductive particles is ejected to the substrate P supported by the stage 307 from the ejecting nozzles of the liquid droplet ejecting head 301.

The X direction driving shaft is connected to an X direction driving motor 302. The X direction driving motor 302 may be a stepping motor and rotates the X direction driving shaft 304 in response to an X direction driving signal from the controller CONT. When the X direction driving shaft 304 rotates, the liquid droplet ejecting head 301 is moved in the X axis direction.

The Y direction guide shaft. 305 is fixed to the stand 309 so as not to move. The stage 307 includes a Y direction driving motor 303. The Y direction driving motor 303 may be a stepping motor and moves the stage 307 in the Y axis direction in response to a Y direction driving signal from the controller CONT.

The controller CONT applies a droplet ejection control voltage to the liquid droplet ejecting head 301. In addition, the controller applies a driving pulse signal for controlling the movement of the liquid droplet ejecting head 301 in the X direction to the X direction driving motor 302 and a driving pulse signal for controlling the movement of the stage 307 in the Y direction to the Y direction driving motor 303.

The cleaning mechanism 308 has a function of cleaning the liquid droplet ejecting head 301. The cleaning mechanism 308 includes a Y direction driving motor (not shown). The cleaning mechanism 308 is moved along the Y direction guide shaft 305 by operation of the Y direction driving motor. The movement of the cleaning mechanism 308 is also controlled by the controller CONT.

The heater 315 is a device for heating the substrate P by means of annealing with a lamp and performs vaporization and drying of a solvent contained in the liquid material applied on the substrate P. The power on/off of the heater 315 is also controlled by the controller CONT.

The liquid droplet ejecting apparatus IJ ejects the liquid droplets to the substrate P while allowing the liquid droplet ejecting head 301 to scan the stage 307 supporting the substrate P. Hereinafter, the X direction is defined as a scan direction, and the Y direction perpendicular to the X direction is defined as a non-scan direction.

Accordingly, the ejecting nozzles of the liquid droplet ejecting head 301 are aligned with a constant interval in the Y direction which is the non-scan direction. In FIG. 6, the liquid droplet ejecting head 301 is disposed perpendicular to the moving direction of the substrate P, but the orientation of the liquid droplet ejecting head 301 may be adjusted to intersect the moving direction of the substrate P. As a result, by adjusting the orientation angle of the liquid droplet ejecting head 301, it is possible to adjust the pitch between the nozzles. A distance between the substrate P and the nozzle surface may be adjusted arbitrarily.

Figure 7:
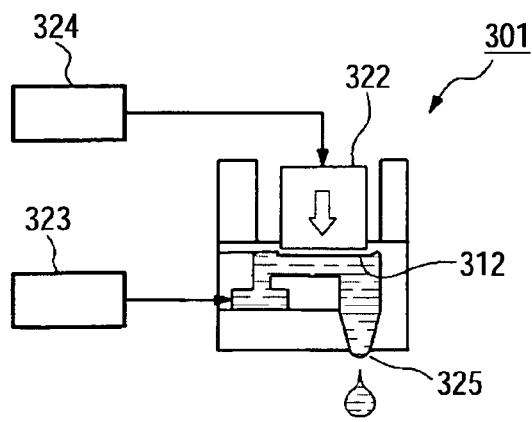
FIG. 7 is a cross sectional view showing a liquid droplet ejecting head.

FIG. 7 is a cross sectional view showing the liquid droplet ejecting head 301.

The liquid droplet ejecting head 301 is provided with a piezoelectric element 322 adjacent to a liquid chamber 321 for receiving the liquid material (wiring ink, etc.). The liquid chamber 321 is supplied with the liquid material through a liquid material supply system 323 including a material tank for containing the liquid material.

The piezoelectric element 322 is connected to a driving circuit 324. By applying a voltage to the piezoelectric element 322 through the driving circuit 324, the piezoelectric element is deformed, and thus, the liquid chamber 321 is deformed, so that the liquid material is ejected from the nozzles 325.

In this case, an amount of the deformation of the piezoelectric element 322 is controlled by varying a value of the applied voltage. In addition, a deformation speed of the piezoelectric element 322 is controlled by varying a frequency of the applied voltage. In the piezoelectric type liquid droplet ejecting method, since the material is not heated, there is an advantage in that a composition of the material is not affected.

Second Process: Formation of Stacked Portion

FIGS. 8 to 11 are views explaining form processes of forming a stacked portion as a second process. FIGS. 8B to 11B are cross sectional views taken along Line A-A' in FIGS. 8A to 11A, and FIGS. 9C to 11C are cross sectional views taken along Line B-B' in FIGS. 9A to 11A, respectively.

In the second process, a stacked portion 35 including an insulating film 31 and a semiconductor film (a contact layer 33 and an active layer 32) is formed at a predetermined position on a layer including the banks 51 and the lattice-patterned wires.

In the views showing the processes, although a new wire line layer is formed on the wire line layers (gate wire lines 40 or the like), the surface of the banks 51 for forming wire lines become lyophobic in the first process. Therefore, when source electrodes or the like intend to be directly formed on the surfaces of the banks 51, the ink for forming the electrodes is repelled from the banks 51, so that a good film pattern cannot be formed. For the reason, in the views showing the processes, before the source electrodes are formed, a lyophobic process is performed in advance on the surfaces of the banks 51 which is a base layer. As the lyophobic process, an UV illumination process or an $O_2$ plasma process using oxygen in the atmospheric ambience as a process gas may be selected. In addition, a combination of these processes may be used. For example, the $O_2$ plasma process is performed with a plasma discharge electrode projecting oxygen in plasma state on the substrate P. As a condition of the $O_2$ plasma process, a plasma power is in a range of from 50 to 1000 W, a flow rate of oxygen gas is in a range of from 50 to 100 ml/min, a reaction speed of the substrate P reacting with the plasma discharge electrode is in a range of from 0.5 to 10 mm/sec, and a temperature of the substrate is in a range of from 70 to 90° C.

After the surface of banks 51 is subject to the lyophilic process, the active layer 32, and the contact layer 33 are sequentially formed on the entire surface of the substrate P by using a plasma CVD method, the insulating film 31. More specifically, as shown in FIG. 8, a silicon nitride film as the insulating film 31, an amorphous silicon film as the active layer 32, and an n+ type silicon film as the contact layer 33 are sequentially formed by varying a raw material gas or a plasma condition.

Next, as shown in FIG. 9, resists 58 (58a to 58c) are disposed at predetermined positions by using a photolithography method. Here, the predetermined positions are located on intersections 56 between the gate wires 40 and the source wires 42, on the gate electrodes 41, and on the capacitor lines 46, as shown in FIG. 9A.

The resist 58a disposed on the intersections 56 and the resists 58b disposed on the capacitor lines 46 are formed so as not to contact each other. In addition, as shown in FIG. 9B, grooves 59 are formed in the resists 58c disposed on the gate electrodes 41 by performing a half exposure.

Next, by etching the entire surface of the substrate P, the contact layer 33 and the active layer 32 are removed. In addition, by performing an etching process, the insulating film 31 is removed.

As a result, as shown in FIG. 10, the contact layer 33, the active layer 32, and the insulating film 31 are removed from the areas excluding the predetermined positions at which the resists 58 (58a to 58c) are disposed. On the other hand, the stacked portion 35 including the insulating film 31 and the semiconductor film (the contact layer 33 and the active layer 32) is formed at the predetermined positions at which the resists 58 are disposed.

In addition, in the stacked portions 35 formed on the gate electrodes 41, the grooves 59 are formed in the resists 58c by performing the half exposure, so the grooves are passed through by performing the half exposure again before performing the etching. As shown in FIG. 10B, the contact layer 33 corresponding to each of the grooves 59 is removed, so that the contact layer is divided in two parts. As a result, the TFTs 30 as switching elements including the active layer 32 and the contact layer 33 are formed on the gate electrodes 41.

As shown in FIG. 11, a silicon nitride film 60a and a fluorinated silicon oxide (FSG: Fluorinated Silica Glass) film 60b as the protective films 60 for protecting the contact layer 33 are formed on the entire surface of the substrate P. The protective films 60a and 60b serve as banks when the pixel electrodes 45 or the like are formed in the later-described third process. The fluorinated material for the protective film 60b is used in order to provide a lyophobic property to the protective film 60b. As another example of a method of providing a lyophobic property to the protective film 60b, there is a method of performing a lyophobic process such as a $CF_4$ plasma process on the protective film 60b. In this case, it is preferable that the lyophobic process for the surface of the protective film 60b which is a top surface layer is performed after the sequential forming of the protective films 60a and 60b, and after that, the patterning is performed. As a result, since the sides of the protective film 60 do not become lyophobic, a wettability to the ink does not deteriorate. In addition, the underlying lyophilic banks 51 cannot become lyophobic.

In this way, the formation of the stacked portion 35 is completed.

Third Process

FIGS. 12 to 15 are views showing a process of forming the pixel electrodes 45 as a third process. FIGS. 12B to 15B are cross sectional views taken along Line A-A' in FIGS. 12A to 15A, respectively, and FIGS. 12C to 15C are cross sectional views taken along Line B-B' in FIGS. 12A to 15A, respectively.

In the third process, the source electrodes 43, the drain electrodes 44, the conductive layer 49, and the pixel electrodes 45 are formed.

The source electrodes 43, the drain electrodes 44, and the conductive layer 49 may be made of the same material as the gate wires 40 or the source wires 42. Since the pixel electrodes 45 need to have a transparent property, it is preferable that the pixel electrodes are made of a light transmitting material such as ITO (Indium Tin Oxide). These elements are formed by using the liquid droplet ejecting method similarly to the first process.

Firstly, resist masks 61 are formed by using the photolithography method so as to cover the gate wires 40 and the source wires 42. Namely, as shown in FIG. 12, the resist masks 61 having an approximate lattice shape are formed. Openings 62 are formed in the intersections 56 between the source wires 42 and the gate wires 40 and between the source wires 42 and the capacitor lines 46. In addition, openings 63 are formed at positions corresponding to the drain regions of TFTs 30.

Figure 12B:
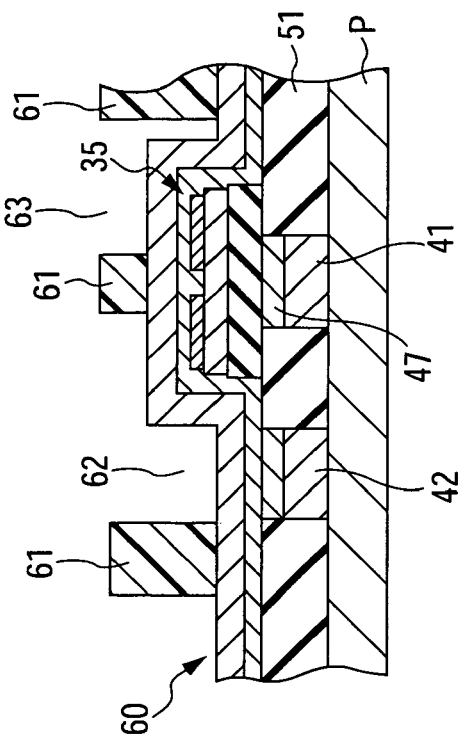
FIG. 12 is a view showing a procedure subsequent to FIG. 11.
Figure 12C:
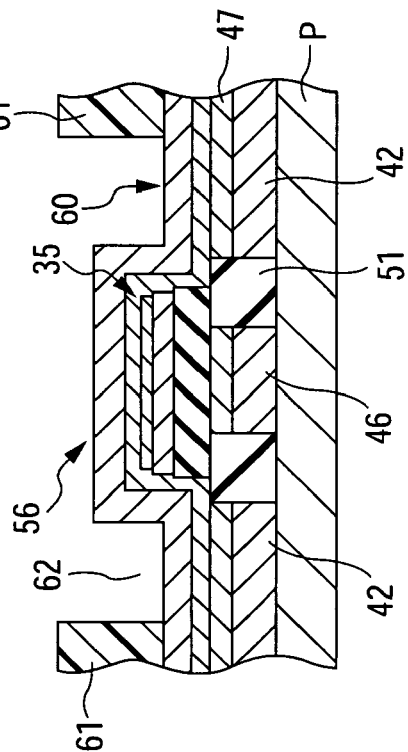
Figure 12A:
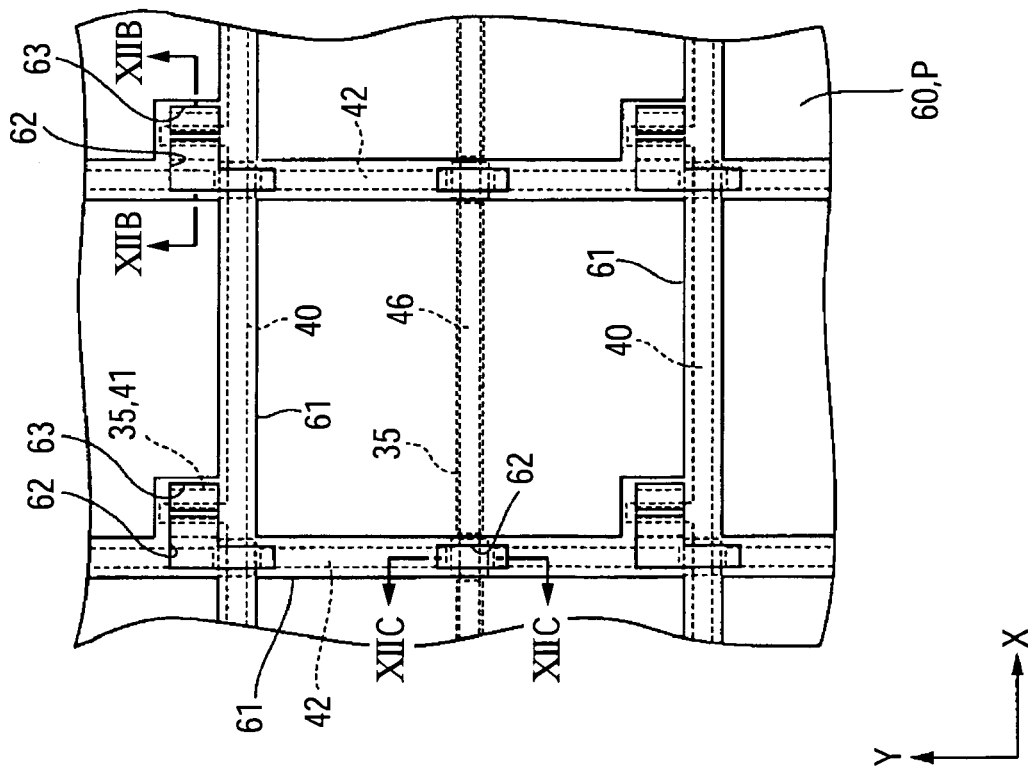

In addition, as shown in FIG. 12B, the openings 62 and 63 are formed to expose some portions of the stacked portions 35 (TFT 30) formed on the gate electrodes 41. Namely, each of resist masks 61 are formed to divide each of the stacked portions 35 (TFTs 30) into two parts in the X direction.

As a material for the banks 61, polymers such as acryl resin, polyimide resin, olefin resin, and melamine resin are used. Among the materials, the most suitable one is selected based on such as an etching selection ratio to the protective films 60.

The openings 62 formed by the resist masks 61 correspond to the positions at which the conductive layers 49 for connecting the divided source wires 42 or the source electrodes 43 are to be formed. In addition, the openings 63 correspond to the positions at which the drain electrodes 44 are formed. In addition, in other regions, the areas surrounded with the resist masks 61 correspond to the positions at which the pixel electrodes 45 are to be formed. Namely, by opening the protective films 60 using the resist mask 61, and then, disposing a conductive material in the openings corresponding to the openings 62 and 63 thereof and in the openings corresponding to the areas surrounded with the resist masks 61, the conductive layer 49 for connecting the divided source wires 42, the source electrodes 43, the drain electrodes 44, and the pixel electrodes 45 are formed.

Next, the protective films 60 formed on the entire surface of the substrate P are removed by an etching process. As a result, as shown in FIG. 13, the protective layers 60 formed in the areas in which the banks 61 are not formed are removed. In addition, the protective metal films 47 formed on the lattice-patterned wires are removed.

Subsequently, the resist masks 61 which are organic films are removed. As a result, only the protective films 60 which are inorganic film formed as the banks.

Next, an electrode forming ink containing materials for the electrodes such as the source electrodes 43 and the drain electrodes 44 is ejected and disposed by the aforementioned liquid droplet ejecting apparatus IJ. The wiring ink used to form the gate wires 40 may be used as the electrode forming ink. After ejecting the transparent conductive material to the substrate P, a dry process and a baking process are performed so as to remove the dispersion medium as needed. By means of the dry process and the baking process, the electrical contact between the conductive particles is secured, thereby obtaining a conductive film.

As a result, as shown in FIG. 14, the conductive layer 49 for connecting the divided source wires 42, the source electrodes 43, and the drain electrodes 44 are formed on the substrate P.

Next, portions of the protective films 60 which are located at boundaries between the pixel electrodes 45 and the drain electrodes 44 are removed with a laser or the like, and a pixel electrode forming material containing the material for the pixel electrodes 45 is ejected and disposed in the areas surrounded with the protective films 60. The pixel electrode forming ink is a dispersion solution in which ITO conductive particles are dispersed in a dispersion medium. After ejecting the pixel electrode forming material to the substrate P, a dry process and a baking process are performed so as to remove the dispersion medium as needed. By means of the dry process and the baking process, the electrical contact between the conductive particles is secured, thereby obtaining a conductive film.

As a result, as shown in FIG. 15, the pixel electrodes 45 electrically connected to the drain electrodes 44 are formed on the substrate P.

The active matrix substrate 20 is manufactured through the processes described above.

Like this, in the embodiment, since the protective films 60 are used as the banks, the banks can have a high thermal-resistant property, and a difference between thermal expansion ratios of the banks and the substrate can be reduced. As a result, deterioration of the banks caused by heat during the drying process of the functional liquid is suppressed, so that the film pattern can have a good shape. In addition, since the protective films 60 are formed with a plurality of layers 60*a* and 60*b*, it is possible to secure a sufficient thickness of the banks. In addition, since the lyophobic property is provided to the protective films 60, it is possible to accurately dispose the ink in only the areas partitioned by the banks. In particular, since the lyophobic property is provided to only the protective films 60*b* which are top surface layers of the protective films 60, it is possible to obtain a state where only the surfaces (top surface layers) become lyophobic, and the sides of the banks do not become lyophobic. As a result, even in a case where a micro pattern is formed, the functional liquid can smoothly flow into the banks, so that the uniformity of the film can be improved.

In the embodiment, since the active matrix substrate 20 is manufactured by using the first process for forming the lattice-patterned wires on the substrate P, the second process for forming the stacked portion 35, and the third process for forming the pixel electrodes 45 or the like, it is possible to reduce the number of processes combining the drying process and the photolithographic etching process. Namely, since the gate wires 40 and the source wires 42 are simultaneously formed, the process combining the drying process and the photolithographic etching process can be reduced by one step.

In addition, since the stacked portions 35(insulating films 31, active layers 32, and contact layers 33) formed at the capacitor lines 46 are formed to be divided so as not to contact the stacked portions 35 formed at the intersections 56, it is possible to avoid the problem in that a current flowing through the source wires 42 flows into the stacked portions 35 on the capacitor lines 46.

Namely, among the layers constituting the stacked portions 35, the contact layers 33 are conductive films, and the conductive layers 49 connecting the source wires 42 are formed on the stacked portions 35 (contact layers 33) on the intersections 56. For the reason, the current flowing through the source wires 42 also flow through the contact layers 33. Therefore, when the stacked portions 35 on the capacitor lines 46 contact the stacked portions 35 on the intersections 56, there occurs the aforementioned problem in that the current flowing through the source wires 42 flows into the stacked portions 35 on the capacitor lines 46.

In the active matrix substrate 20 according to the invention, since the problem can be avoided, it is possible to obtain a desired performance.

In the embodiment, the case where the source wires 42 are divided at the intersections 56 has been described. However, the gate wires 40 or the capacitor lines 46 may be divided at the intersections 56. However, since the capacitor lines 46 influences display more greatly that the source wires 42, it is preferable that the structure where the source wires 42 are divided is employed in a case where a high display quality is required.

In addition, although the preferred examples of the active matrix substrate are described in the embodiment, the shapes or combinations of the elements is not limited to the preferred examples. For example, instead of FIG. 10, the shapes and arrangements of the stacked portions 35 shown in FIG. 16 may be employed. In this case, since the source regions and source wires 42 are closely disposed, the areas where the source electrodes 43 are formed can be reduced, so that it is possible to manufacture an active matrix substrate having a higher performance.

In addition, although the method of forming the film pattern according to the invention is used as the process for forming the pixel electrodes 45 in the embodiment, the invention may be used for the processes forming other patterns such as gate wires.

Electro-Optical Device

Next, a liquid crystal display device 100 as an example of an electro-optical device employing the active matrix substrate 20 will be described.

Figure 17:
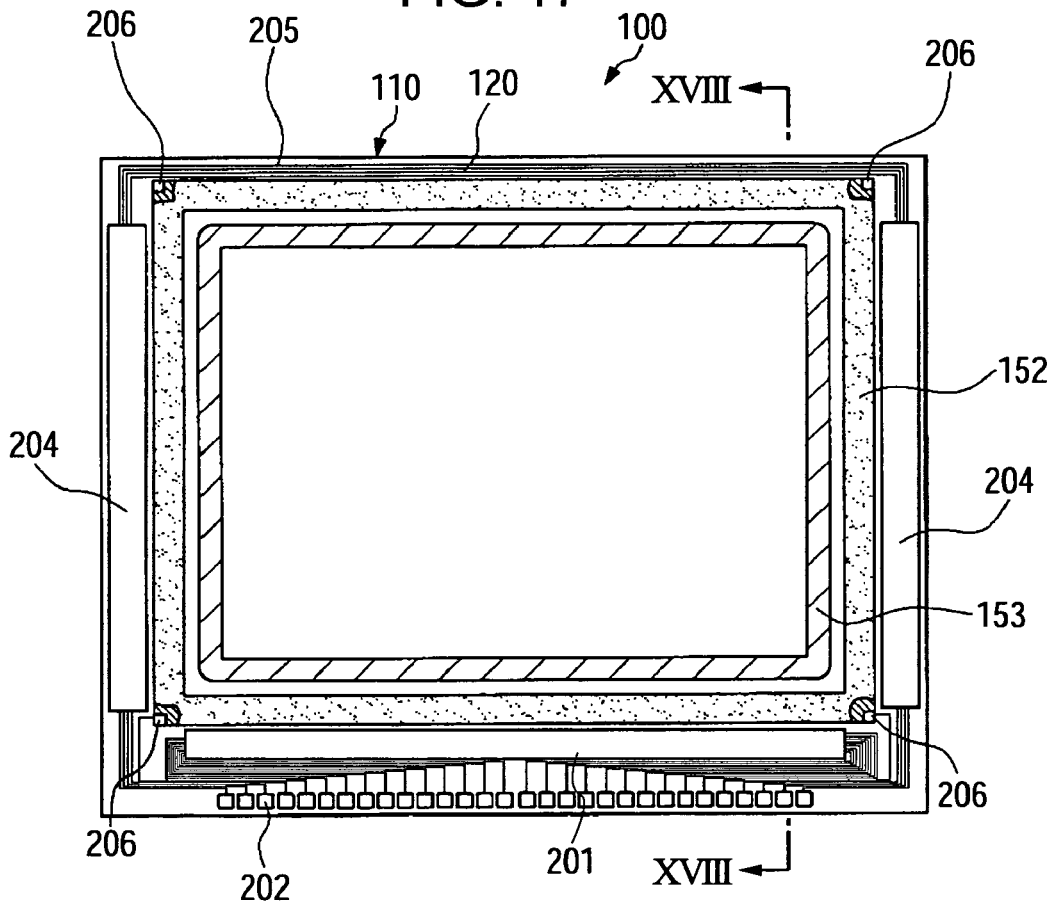
FIG. 17 is a plan view showing a liquid crystal display apparatus as seen from a counter substrate side.
Figure 18:
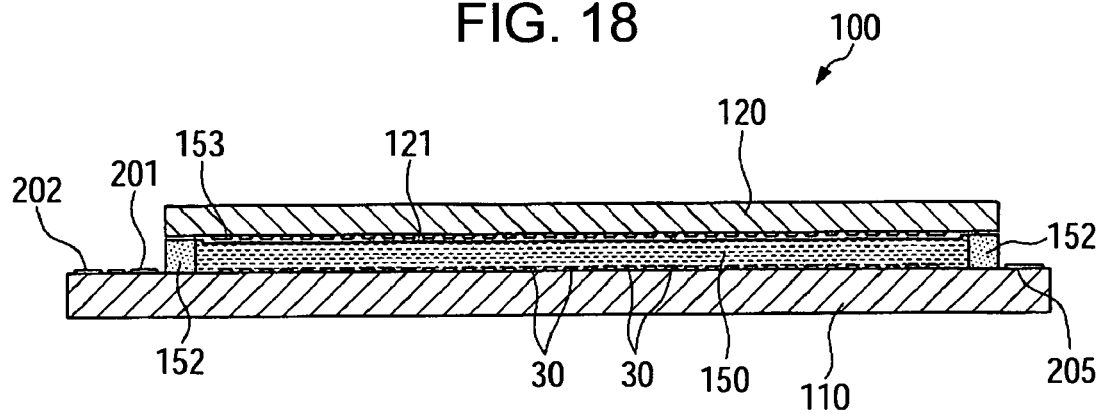
FIG. 18 is a cross sectional view showing a liquid crystal display apparatus.

FIG. 17 is a plan view sowing the liquid crystal display device 100 as seen from the counter substrate side, and FIG. 18 is a cross sectional view taken along Line H-H' of FIG. 17.

In the drawings referred to in the following description, in order to recognize the layers and the members, scales of the layers and the members are different.

In FIGS. 17 and 18, the liquid crystal display device (electro-optical device) 100 has a TFT array substrate 110 having the active matrix substrate 20 and a counter substrate 120 which are bonded to each other with a sealing member 152 as a photo-curing enclosing material. The liquid crystal 150 is injected and held in the area partitioned by the sealing member 152. The sealing member 152 is constructed in a closed frame shape in the area within the substrate plane and has no sealing trace without a liquid crystal injection port.

A peripheral partitioning portion 153 made of a light-shielding material is formed inside the sealing member 152. A data-line driving circuit 201 and mounting terminals 202 are formed along one side of the TFT array substrate 110 outside the sealing member 152, and scanning-line driving circuits 204 are formed along two sides adjacent to the one side. A plurality of wires 205 for connecting the scanning-line driving circuits 204 provided at both sides of the image display area are provided along the other side of the TFT array substrate 110. An inter-substrate electrical connection member 206 for electrically connecting the TFT array substrate 110 and the counter substrate 120 is provided to at least one corner of the counter substrate 120.

Instead of forming the data-line driving circuit 201 and the scanning-line driving circuits 204 on the TFT array substrate 110, terminal groups formed in the peripheral portions of the TFT array substrate 110 and a TAB (Tape Automated Bonding) substrate with a driving LSI mounted may be electrically and mechanically connected through an anisotropic conductive film.

In addition, in the liquid crystal display device 100, a retardation film, a polarizing film, and the like are disposed in a predetermined direction in accordance with types of the liquid crystal 150 to be used, that is, operation modes such as TN (Twisted Nematic) mode, C-TN mode, VA mode, and IPS mode, or normally-white mode/normally-black mode (not shown in the figure).

In a case where the liquid crystal display device 100 is constructed as a color display one, color filters of red (R), green (G), and blue (B) together with protective films thereof are formed in areas of the counter substrate 120 facing the pixel electrodes on the TFT array substrate 110.

In the liquid crystal display apparatus 100, since the active matrix substrate 20 is manufactured by using the aforementioned method, it is possible to obtain a display apparatus having a high quality display.

In addition, although the method of forming the film pattern according to the invention is employed as the method of forming a wire structure of the liquid crystal display apparatus in the embodiment, the invention is not limited thereto, but it may be employed for processes for forming color filters on the active matrix substrate or the counter substrate.

In addition to the liquid crystal display apparatus, the active matrix substrate may be used for other electro-optical devices, for example, an organic EL (Electroluminescence) display device. The organic EL display device has a structure that a thin film including inorganic and organic fluorescent compounds is interposed between a cathode and an anode. The organic EL display device is a light emitting device that generates excitons by injecting electrons and holes into the thin film to excite the thin film and emits light by using luminescence (fluorescence or phosphorescence) of light when the excitons are recombined. By preparing materials exhibiting red, green, and blue colors, that is, materials for light-emitting layers, and materials for hole injecting layer and electron transport layers in an ink type among the fluorescent materials used for the organic EL display device and patterning the respective materials the aforementioned substrate having the TFTs 30, it is possible to manufacture a self-emission full color organic EL display device. The electro-optical apparatus according to the invention also includes such an organic EL device. In addition, in the organic EL display apparatus, the method of forming the film pattern according to the invention can be employed as a method of forming the materials for the hole injecting/transporting layers or light-emitting layers.

In addition, the active matrix substrate 20 may be used for PDP (Plasma Display Panel) or a surface conduction type electron emission device using a phenomenon that electron emission occurs by allowing current to flow in a small-area thin film formed on a substrate in a direction parallel to a film surface thereof.

Electronic Apparatus

Now, a specific example of an electronic apparatus according to the invention will be described.

Figure 19A:
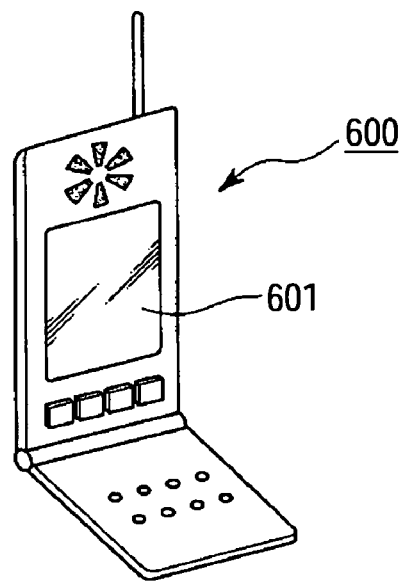
FIG. 19 is a view showing a specific example of an electronic apparatus.

FIG. 19A is a perspective view showing an example of a mobile phone. In FIG. 19A, reference numeral 600 denotes a mobile phone body, and reference numeral 601 denotes a display unit having the liquid crystal display device 100 according to the aforementioned embodiment.

Figure 19B:
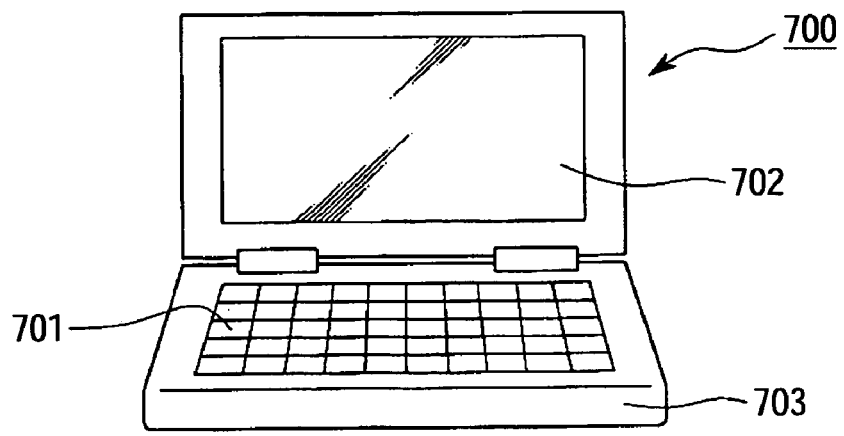

FIG. 19B is a perspective view showing an example of a portable information processing apparatus such as a word processor and a personal computer. In FIG. 19B, reference numeral 700 denotes an information processing apparatus, reference numeral 701 denotes an input unit such as a keyboard, reference numeral 703 denotes an information processing apparatus body, and reference numeral 702 denotes a display unit having the liquid crystal display device 100 according to the aforementioned embodiment.

Figure 19C:
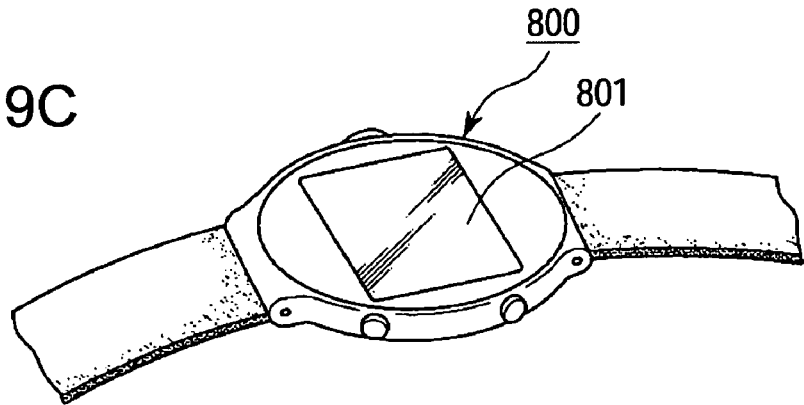

FIG. 19C is a perspective view showing an example of a wristwatch-type electronic apparatus. In FIG. 19C, reference numeral 800 denotes a watch body, and reference numeral 801 denotes a display unit having the liquid crystal display device 100 according to the aforementioned embodiment.

Since the electronic apparatuses shown in FIGS. 19A to 19C have the liquid crystal display device 100 according to the aforementioned embodiment, it is possible to obtain high quality and performance.

In addition, the embodiments of the invention can be applied to a large-sized liquid crystal panel such as a television and a monitor.

Although the electronic apparatus according to the embodiment has the liquid crystal display device 100, the electronic apparatus may employ other electro-optical devices such as an organic electroluminescence display device and a plasma display device.

Although the exemplary embodiments of the present invention have been hitherto described with reference to the accompanying drawings, the invention is not limited to the exemplary embodiments. The shapes or combinations of the elements shown in the exemplary embodiments are only examples and can be variously changed in response to design requirements without departing from the gist of the invention.

What is claimed is:

1. A method of forming a film pattern by disposing a functional liquid on a substrate, comprising:
   forming banks on the substrate;
   disposing the functional liquid in areas partitioned by the banks; and
   drying the functional liquid disposed on the substrate,
   wherein the forming of the banks including:
   forming a plurality of layers made of inorganic materials;
   patterning a plurality of the layers by using an organic mask;
   removing the organic mask;
   before the patterning of the layers, performing a lyophobic process on a top surface layer such that only the top surface layer becomes lyophobic.

2. The method according to claim 1, wherein the functional liquid is disposed in the areas by using a liquid droplet ejecting method.

3. A method of manufacturing a device having a film pattern formed on a substrate, comprising forming the film pattern on the substrate by using the method according to claim 1.

4. The method according to claim 3, wherein the film pattern constitutes a portion of a switching element disposed on the substrate.

* * * * *